(12) United States Patent
Suarez et al.

(10) Patent No.: US 10,930,808 B2
(45) Date of Patent: Feb. 23, 2021

(54) HYBRID MOCVD/MBE EPITAXIAL GROWTH OF HIGH-EFFICIENCY LATTICE-MATCHED MULTIJUNCTION SOLAR CELLS

(71) Applicant: ARRAY PHOTONICS, INC., Tempe, AZ (US)

(72) Inventors: Ferran Suarez, Chandler, AZ (US); Ting Liu, San Jose, CA (US); Arsen Sukiasyan, Plainsboro, NJ (US); Ivan Hernandez, Gilbert, AZ (US); Jordan Lang, Sunnyvale, CA (US); Radek Roucka, East Palo Alto, CA (US); Sabeur Siala, Sunnyvale, CA (US); Aymeric Maros, San Francisco, CA (US)

(73) Assignee: ARRAY PHOTONICS, INC., Tempe, AZ (US)

( * ) Notice: Subject to any disclaimer, the term of this patent is extended or adjusted under 35 U.S.C. 154(b) by 0 days.

(21) Appl. No.: 16/018,917

(22) Filed: Jun. 26, 2018

(65) Prior Publication Data

US 2019/0013429 A1 Jan. 10, 2019

Related U.S. Application Data

(60) Provisional application No. 62/529,214, filed on Jul. 6, 2017.

(51) Int. Cl.
*H01L 31/0687* (2012.01)
*H01L 31/0304* (2006.01)
(Continued)

(52) U.S. Cl.
CPC .... *H01L 31/0687* (2013.01); *H01L 31/03042* (2013.01); *H01L 31/03044* (2013.01);
(Continued)

(58) Field of Classification Search
CPC .......... H01L 31/0687; H01L 31/03042; H01L 31/03044; H01L 31/03046; H01L 31/03048
See application file for complete search history.

(56) References Cited

U.S. PATENT DOCUMENTS

| | | | |
|---|---|---|---|
| 4,127,862 A | 11/1978 | Ilegmes et al. | |
| 4,179,702 A | 12/1979 | Lamorte | |

(Continued)

FOREIGN PATENT DOCUMENTS

| | | |
|---|---|---|
| CN | 1917241 A | 2/2007 |
| CN | 102280587 A | 12/2011 |

(Continued)

OTHER PUBLICATIONS

Search Report for Singapore Application No. 11201606353T, dated Jun. 22, 2018, 7 pages.

(Continued)

*Primary Examiner* — Lindsey A Bernier
(74) *Attorney, Agent, or Firm* — Morrison & Foerster LLP

(57) ABSTRACT

Semiconductor devices and methods of fabricating semiconductor devices having a dilute nitride layer and at least one semiconductor material overlying the dilute nitride layer are disclosed. Hybrid epitaxial growth and the use of aluminum barrier layers to minimize hydrogen diffusion into the dilute nitride layer are used to fabricate high-efficiency multijunction solar cells.

6 Claims, 18 Drawing Sheets

| Layer Name | Layer Function | |
|---|---|---|
| InGaAs | InGaAs Contact | 336 |
| InAlP | FSF (Front Surface Field) | 334 |
| AlGaInP | Emitter | 332 |
| AlGaInP | Base | 330 |
| AlGaInP | BSF (Back Surface Field) | 328 |
| AlGaAs | Tunnel Junction | 326 |
| GaAs | Tunnel Junction | |
| AlGaInP | FSF (Front Surface Field) | 324 |
| AlGaAs | Emitter | 322 |
| AlGaAs | Base | 320 |
| AlGaAs or other Al-layer | BSF (Back Surface Field) and Hydrogen Barrier | 318 |
| InGaAs | Tunnel Junction and Protective Cap Layer | 316 |
| InGaAs | Tunnel Junction | |
| InGaAs | Emitter | 314 |
| GaInNAsSb | Base | 312B |
| GaInNAsSb | Base | 312A |
| InGaAs | BSF (Back Surface Field) | 310 |
| InGaAs | Tunnel Junction 308B | 308 |
| InGaAs | Tunnel Junction 308A | |
| InGaAs | Buffer Layer | 306 |
| InGaP | Nucleation Layer | 304 |
| (Se,Sn) Ge | Substrate, Base | 302 |

(305 groups rows 336–326; 303 groups rows 324–318; 301 groups rows 316–310)

(51) Int. Cl.
  *H01L 31/18* (2006.01)
  *H01L 31/20* (2006.01)
  *H01L 31/078* (2012.01)

(52) U.S. Cl.
  CPC .. *H01L 31/03046* (2013.01); *H01L 31/03048* (2013.01); *H01L 31/078* (2013.01); *H01L 31/1848* (2013.01); *H01L 31/1864* (2013.01); *H01L 31/1868* (2013.01); *H01L 31/206* (2013.01)

(56) References Cited

U.S. PATENT DOCUMENTS

| | | |
|---|---|---|
| 4,404,421 A | 9/1983 | Fraas |
| 4,547,622 A * | 10/1985 | Fan .................... H01L 31/0693 136/249 |
| 4,682,196 A | 7/1987 | Sakai et al. |
| 4,881,979 A | 11/1989 | Lewis |
| 4,935,384 A | 6/1990 | Wanlass |
| 5,009,719 A | 4/1991 | Yoshida |
| 5,016,562 A | 5/1991 | Madan et al. |
| 5,166,761 A | 11/1992 | Olson et al. |
| 5,223,043 A | 6/1993 | Olson et al. |
| 5,316,593 A | 5/1994 | Olson et al. |
| 5,342,453 A | 8/1994 | Olson et al. |
| 5,376,185 A | 12/1994 | Wanlass |
| 5,405,453 A | 4/1995 | Ho et al. |
| 5,689,123 A | 11/1997 | Major et al. |
| 5,800,630 A | 9/1998 | Vilela et al. |
| 5,911,839 A | 6/1999 | Tsai et al. |
| 5,935,345 A | 8/1999 | Kuznicki |
| 5,944,913 A | 8/1999 | Hou et al. |
| 6,069,353 A | 5/2000 | Jung et al. |
| 6,150,603 A | 11/2000 | Karam et al. |
| 6,252,287 B1 | 6/2001 | Kurtz et al. |
| 6,281,426 B1 | 8/2001 | Olson et al. |
| 6,340,788 B1 | 1/2002 | King et al. |
| 6,504,091 B2 | 1/2003 | Hisamatsu et al. |
| 6,617,618 B2 | 9/2003 | Sato |
| 6,660,928 B1 | 12/2003 | Patton et al. |
| 6,756,325 B2 | 6/2004 | Bour et al. |
| 6,764,926 B2 | 7/2004 | Takeuchi et al. |
| 6,765,238 B2 | 7/2004 | Chang et al. |
| 6,787,385 B2 | 9/2004 | Barber et al. |
| 6,815,736 B2 | 11/2004 | Mascarenhas |
| 6,951,819 B2 | 10/2005 | Iles et al. |
| 7,045,833 B2 | 5/2006 | Campbell et al. |
| 7,071,407 B2 | 7/2006 | Faterni et al. |
| 7,119,271 B2 | 10/2006 | King et al. |
| 7,122,733 B2 | 10/2006 | Narayanan et al. |
| 7,122,734 B2 | 10/2006 | Fetzer et al. |
| 7,123,638 B2 | 10/2006 | Leary et al. |
| 7,126,052 B2 | 10/2006 | Fetzer et al. |
| 7,161,170 B1 | 1/2007 | Yoder |
| 7,255,746 B2 | 8/2007 | Johnson et al. |
| 7,279,732 B2 | 10/2007 | Meng et al. |
| 7,709,287 B2 | 5/2010 | Fatemi et al. |
| 7,727,795 B2 | 6/2010 | Stan et al. |
| 7,807,921 B2 | 10/2010 | Fetzer et al. |
| 7,842,881 B2 | 11/2010 | Cornfeld et al. |
| 8,029,905 B2 | 10/2011 | Kouvetakis et al. |
| 8,067,687 B2 | 11/2011 | Wanlass |
| 8,093,559 B1 | 1/2012 | Rajavel |
| 8,575,473 B2 | 11/2013 | Jones et al. |
| 8,636,844 B1 | 1/2014 | Dargis et al. |
| 8,697,481 B2 | 4/2014 | Jones-Albertus et al. |
| 8,716,593 B2 | 5/2014 | Meusel et al. |
| 8,912,433 B2 | 12/2014 | Jones et al. |
| 8,957,376 B1 | 2/2015 | Tkachuk et al. |
| 8,962,993 B2 | 2/2015 | Jones-Albertus et al. |
| 9,018,521 B1 | 4/2015 | Cornfeld |
| 9,153,724 B2 | 10/2015 | Jones-Albertus et al. |
| 9,214,580 B2 | 12/2015 | Misra et al. |
| 9,240,514 B2 | 1/2016 | Gori et al. |
| 9,252,313 B2 | 2/2016 | Meusel et al. |
| 9,257,586 B2 | 2/2016 | Meusel et al. |
| 9,502,598 B2 | 11/2016 | Meusel et al. |
| 9,741,888 B2 | 8/2017 | Meusel et al. |
| 9,748,426 B2 | 8/2017 | Meusel et al. |
| 9,768,339 B2 | 9/2017 | Yanka et al. |
| 2002/0000546 A1 | 1/2002 | Sato |
| 2002/0195137 A1 | 12/2002 | King et al. |
| 2003/0047752 A1 | 3/2003 | Campbell et al. |
| 2003/0070707 A1 | 4/2003 | King et al. |
| 2003/0145884 A1 | 8/2003 | King et al. |
| 2004/0045598 A1 | 3/2004 | Narayanan et al. |
| 2004/0130002 A1 | 7/2004 | Weeks et al. |
| 2004/0200523 A1 | 10/2004 | King et al. |
| 2005/0139863 A1 | 6/2005 | Welser et al. |
| 2005/0155641 A1 | 7/2005 | Fafard |
| 2005/0274409 A1 | 12/2005 | Fetzer et al. |
| 2006/0048811 A1 | 3/2006 | Krut |
| 2006/0144435 A1 | 7/2006 | Wanlass |
| 2006/0162768 A1 | 7/2006 | Wanlass et al. |
| 2007/0034853 A1 | 2/2007 | Robbins et al. |
| 2007/0113887 A1 | 5/2007 | Laih et al. |
| 2007/0131275 A1 | 6/2007 | Kinsey et al. |
| 2007/0227588 A1 | 10/2007 | Gossard et al. |
| 2008/0035939 A1 | 2/2008 | Puetz et al. |
| 2008/0149173 A1 | 6/2008 | Sharps |
| 2008/0245400 A1 | 10/2008 | Li |
| 2008/0257405 A1 | 10/2008 | Sharps |
| 2009/0001412 A1 | 1/2009 | Nagai et al. |
| 2009/0014061 A1 | 1/2009 | Harris et al. |
| 2009/0057721 A1 | 3/2009 | Miura et al. |
| 2009/0078310 A1 | 3/2009 | Stan et al. |
| 2009/0145476 A1 | 6/2009 | Fetzer et al. |
| 2009/0155952 A1 | 6/2009 | Stan et al. |
| 2009/0218595 A1 | 9/2009 | Ishimura et al. |
| 2009/0229659 A1 | 9/2009 | Wanlass et al. |
| 2009/0255575 A1 | 10/2009 | Tischler |
| 2009/0255576 A1 | 10/2009 | Tischler |
| 2009/0272438 A1 | 11/2009 | Cornfeld |
| 2009/0288703 A1 | 11/2009 | Stan et al. |
| 2010/0072457 A1 | 3/2010 | Iguchi et al. |
| 2010/0087028 A1 | 4/2010 | Porthouse et al. |
| 2010/0096001 A1 | 4/2010 | Sivananthan et al. |
| 2010/0096665 A1 | 4/2010 | MacDougal et al. |
| 2010/0116318 A1 | 5/2010 | Sumida et al. |
| 2010/0147366 A1 | 6/2010 | Stan et al. |
| 2010/0180936 A1 | 7/2010 | Kim |
| 2010/0186818 A1 | 7/2010 | Okorogu et al. |
| 2010/0218819 A1 | 9/2010 | Farmer et al. |
| 2010/0282305 A1 | 11/2010 | Sharps et al. |
| 2010/0282306 A1 | 11/2010 | Sharps et al. |
| 2010/0319764 A1 | 12/2010 | Wiemer et al. |
| 2011/0023958 A1 | 2/2011 | Masson et al. |
| 2011/0039400 A1 | 2/2011 | Yoon et al. |
| 2011/0073973 A1 | 3/2011 | Nakaji et al. |
| 2011/0114163 A1 | 5/2011 | Wiemer et al. |
| 2011/0210313 A1 | 9/2011 | Fujii et al. |
| 2011/0232730 A1 | 9/2011 | Jones et al. |
| 2011/0254052 A1 | 10/2011 | Kouvetakis et al. |
| 2011/0291109 A1 | 12/2011 | Wraback et al. |
| 2011/0303268 A1 | 12/2011 | Tan et al. |
| 2012/0031478 A1 | 2/2012 | Boisvert et al. |
| 2012/0103403 A1 | 5/2012 | Misra et al. |
| 2012/0153417 A1 | 6/2012 | Jin-Wei et al. |
| 2012/0167965 A1 | 7/2012 | Lin et al. |
| 2012/0211071 A1 | 8/2012 | Newman et al. |
| 2012/0216858 A1 | 8/2012 | Jones-Albertus et al. |
| 2012/0216862 A1 | 8/2012 | Abou-Kandil et al. |
| 2012/0227797 A1 | 9/2012 | Stan et al. |
| 2012/0285526 A1 | 11/2012 | Jones-Albertus et al. |
| 2013/0014815 A1 | 1/2013 | Jones-Albertus et al. |
| 2013/0074901 A1* | 3/2013 | Walukiewicz ...... H01L 31/0687 136/244 |
| 2013/0112239 A1 | 5/2013 | Liptac et al. |
| 2013/0118546 A1 | 5/2013 | Jones-Albertus et al. |
| 2013/0118566 A1* | 5/2013 | Jones-Albertus ....... H01L 31/06 136/255 |
| 2013/0220409 A1 | 8/2013 | Jones-Albertus et al. |
| 2014/0182667 A1 | 7/2014 | Richards et al. |
| 2014/0261653 A1 | 9/2014 | Krause et al. |

(56) References Cited

U.S. PATENT DOCUMENTS

| | | | |
|---|---|---|---|
| 2014/0326300 | A1 | 11/2014 | Fuhrmann |
| 2015/0187971 | A1 | 7/2015 | Sweeney et al. |
| 2015/0214412 | A1 | 7/2015 | Jones-Albertus et al. |
| 2015/0221803 | A1 | 8/2015 | Suarez et al. |
| 2015/0357501 | A1 | 12/2015 | Derkacs et al. |
| 2016/0005909 | A1 | 1/2016 | Newman |
| 2016/0118526 | A1 | 4/2016 | Misra et al. |
| 2016/0190376 | A1 | 6/2016 | Campesato et al. |
| 2016/0300973 | A1 | 10/2016 | Shen et al. |
| 2016/0372624 | A1 | 12/2016 | Yanka et al. |
| 2017/0036572 | A1 | 2/2017 | Hansen et al. |
| 2017/0110613 | A1 | 4/2017 | Suarez et al. |
| 2017/0200845 | A1 | 7/2017 | King et al. |
| 2017/0338357 | A1 | 11/2017 | Liu et al. |
| 2019/0252567 | A1 | 8/2019 | Yoon et al. |

FOREIGN PATENT DOCUMENTS

| | | | |
|---|---|---|---|
| CN | 103426965 | A | 12/2013 |
| CN | 104282793 | A | 1/2015 |
| CN | 106711253 | A | 5/2017 |
| CN | 107644921 | A | 1/2018 |
| JP | 63100781 | A | 5/1988 |
| JP | 6061513 | A | 3/1994 |
| JP | 6061516 | A | 3/1994 |
| JP | 10012905 | A | 1/1998 |
| JP | 2006-270060 | A | 10/2006 |
| JP | 2008-270760 | A | 11/2008 |
| TW | 200721518 | | 6/2007 |
| TW | 200924214 | A | 6/2009 |
| TW | 201228004 | | 7/2012 |
| TW | 201316382 | | 4/2013 |
| TW | 201436252 | A | 9/2014 |
| WO | 2010/130421 | A1 | 11/2010 |
| WO | 2010/151533 | A1 | 12/2010 |
| WO | 2011/062886 | A1 | 5/2011 |
| WO | 2011/123164 | A1 | 10/2011 |
| WO | 2012/057874 | A1 | 5/2012 |
| WO | 2012/115838 | A1 | 8/2012 |
| WO | 2012/154455 | A1 | 11/2012 |
| WO | 2018/078348 | A1 | 5/2018 |
| WO | 2019/067553 | A1 | 4/2019 |

OTHER PUBLICATIONS

Final Office Action for U.S. Appl. No. 14/614,601, dated May 17, 2018, 13 pages.

Aho et al., "Determination of Composition and Energy Gaps of GaInNAsSb Layers Grown by MBE," Journal of Crystal Growth, 2016, vol. 438, p. 49-54.

Andreev et al., "High Current Density GaAs and GaSb Photovoltaic Cells for Laser Power Beaming", 3rd World Conference on Photovoltaic Energy conversion, May 11-18, 2003, Osaka, Japan, 4 pages.

Bank, et al., "Molecular-beam epitaxy growth of low-threshold cw GaInNAsSb lasers at 1.5 μm," pp. 1337-1340, J. Vac. Sci. Technol. B 23(3), May/Jun. 2005.

Bank et al., "Recent Progress on 1.55-um Dilute-Nitride Lasers," IEEE Journal of Quantum Electronics, Sep. 2007, vol. 43, No. 9, 13 pages.

Baribeau et al., "Heteroepitaxy of Ge on (100) Si substrates," Journal of Vacuum Science & Technology, Jul./Aug. 1987, A 5 (4), 6 pages.

Bertness et al., "29.5%-Efficient GaInP/GaAs Tandem Solar Cells," Applied Physics Letters, vol. 65, Aug. 22, 1994, pp. 989-991.

Bett et al., "III-V Solar Cells Under Monochromatic Illumination", IEEE transactions on Electron Devices, 2008, 5 pages.

Bhuiyan et al., "InGaN Solar Cells: Present State of the Art and Important Challenges", IEEE Journal of Photovoltaics, vol. 2, No. 3, Jul. 2012, p. 246-293.

Cheah et al., "GaAs-Based Heterojunction p-i-n Photodetectors Using Pentanary InGaAsNSb as the Intrinsic Layer," IEEE Photonics Technology Letters, Sep. 2005, vol. 17, No. 9, 3 pages.

Chen et al., "GaAsSbN/GaAs long wavelength PIN detectors," Indium Phosphide and Related Materials, 2008, 20th International Conference on Versailles, 4 pages.

Cornfeld et al., "Evolution of a 2.05 eV AlGaInP Top Sub-cell for 5 and 6J-IMM Applications", Photovoltaic Specialists Conference (PVSC), 38th IEEE, Jun. 3, 2012, p. 2788-2791.

Cotal et al., "III-V multijunction solar cells for concentrating photovoltaics" pp. 174-192, www.rsc.org/ees, Energy and Environmental Science 2, (2009).

Dargis et al., "Growth and application of epitaxial heterostructures with polymorphous rare-earth oxides," Journal of Crystal Growth, 2013, vol. 378, p. 177-179.

Denton et al., Vegard's Law, Physical Review, A, The American Physical Society, vol. 43 No. 6, pp. 3161-3164 (1991).

Ferguson et al., "Optical Gain in GaInNAs and GaInNAsSb Quantum Wells," IEEE Journal of Quantum Electronics, Jun. 2011, vol. 47, No. 6, 8 pages.

Ferguson et al., Nonradiative Recombination in 1.56 μm GaInNAsSb/GaNAs Quantum-Well Lasers, pp. 1-3, published online Dec. 8, 2009, Applied Physics Letters 95, 231104 (2009).

Fewster P.F., "X-Ray Scattering From Semiconductors" Second Edition, Imperial College Press, London, 2003, Ch. 1, pp. 1-22.

Friedman et al., "1-eV Solar cells with GaInNAs active layer", Journal of Crystal Growth, vol. 195, 1998, p. 409-415.

Friedman et al., "Analysis of the GaInP/GaAs/1-eV/Ge Cell and Related Structures for Terrestrial Concentration Application," pp. 856-859, Conference Record of the Twenty-ninth IEEE Photovoltaic Specialists Conference, New Orleans, LA., May 19-24, 2002.

Friedman et al., Breakeven Criteria for the GaInNAs Junction in GaInP/GaAs/GaInNAs/Ge Four-junction Solar Cells, pp. 331-344, Progress in Photovoltaics: Research and Applications. (2002).

Friedman et al., "Analysis of Depletion-Region Collection in GaInNAs Solar Cells," pp. 691-694, Conference Record of the Thirty-first IEEE Photovoltaic Specialists Conference, Lake Buena Vista, Florida, Jan. 3-7, 2005.

Garcia et al., Analysis of Tellurium as N-Type Dopant in GaInP: Doping, Diffusion, Memory Effect and Surfactant Properties, pp. 794-799, Journal of Crystal Growth 298 (2007).

Geelen et al., Epitaxial Lift-Off GaAs Solar Cell From a Reusable GaAs Substrate, pp. 162-171, Materials Science and Engineering B45 (1997).

Geisz et al., "Inverted GaInP / (In)GaAs / InGaAs triple-junction solar cells with low-stress metamorphic bottom junctions," Proceedings of the 33rd IEEE PVSC Photovoltaics Specialists Conference, (2008).

Gobet et al., "GaInNAsSb/GaAs vertical cavity surface-emitting lasers (VCSELs): Current challenges and techniques to realize multiple-wavelength laser arrays at 1.55um," Proc. of SPIE, Feb. 2008, vol. 6908, 13 pages.

Green et al., Progress in Photovoltaics: Research and Applications 19 (2011) pp. 565-572.

Green et al., Progress in Photovoltaics: Research and Applications 20 (2012) pp. 12-20.

Green, "Third Generation Photovoltaics: Advanced Solar Energy Conversion," pp. 95-109, Springer Publishing, Berlin, Germany (2003).

Green, Do Built-in Fields Improve Solar Cell Performance? pp. 57-66, Progress in Photovoltaics: Research and Applications (2009), Published online in Wiley InterScience (www.interscience.wiley.com) on Oct. 1, 2008.

Gu et al., "Gas Source Growth and Doping Characteristics of AlInP on GaAs" Materials Science and Engineering B 131 (2006), pp. 49-53.

Gubanov et al., "Dynamic of time-resolved photoluminescence in GaInNAs and GaNAsSb solar cells," Nanoscale Research Letters, 2014, vol. 9, No. 80, 4 pages.

Harris Jr. et al., "Development of GaInNAsSballoys: Growth, band structure, optical properties and applications," 2007, Physics Status Solidi(b), vol. 244, Issue 8, pp. 2707-2729.

Harris Jr. et al., "The opportunities, successes and challenges for GaInNAsSb," Journal of Crystal Growth, Mar. 2005, vol. 278, 15 pages.

(56) References Cited

OTHER PUBLICATIONS

Hovel H.J., "Semiconductors and Semimetals", Academic Press, New York, 1975, Ch. 2, pp. 8-47.
Jackrel et al., "Thick lattice-matched GaInNAs films in photodetector applications," Proc. of SPIE, 2005, vol. 5728, 8 pages.
Jackrel, D. B., "InGaAs and GaInNAs(Sb) 1064 NM Photodectectors and Solar Cells on GaAs Substrates," A Dissertation submitted to the Department of Materials Science and Engineering and the Committee on Graduate Studies of Stanford University, 2005, 264 pages.
Jackrel et al., "Dilute Nitride GaInNAs and GaInNAsSb Solar Cells by Molecular Beam Epitaxy," Journal of Applied Physics, 2007, vol. 101, p. 114916.
Jackrel et al., "GaInNAsSb Solar Cells Grown by Molecular Beam Epitaxy," pp. 1-16, IEEE 4th World Conference on Photovoltaic Energy Conversion, Waikoloa, HI, 2006.
Jackrel et al., "GaInNAsSb Solar Cells Grown by Molecular Beam Epitaxy," 2006. Photovoltaic Energy Conversion, Conference Record of the 2006 IEEE 4th World Conference, vol. 1, p. 783-786, May 2006.
Jackrel et al., "Dilute nitride GainNAs and GainNAsSb solar cells by molecular beam epitaxy", pp. 1-8, Journal of Applied Physics 101 (114916), Jun. 14, 2007.
Janotti et. al., Mutual Passivation of Electrically Active and Isovalent Impurities in Dilute Nitrides, Physical Review Letters 100, 045505 (2008).
Janotti et al., "Effects of Hydrogen on the Electronic Properties of Dilute GaAsN Alloys," The American Chemical Society, Aug. 2002, vol. 89, No. 8, p. 086403.
Khalil et al., "Photoconductivity and photoluminescence under bias in GaInNAs/GaAs MQW p-i-n structures," Nanoscale Research Letter, 2012, vol. 7, No. 539, 4 pages.
Kim et al., "Characteristics of bulk InGaInNAs and InGaAsSbN materials grown by metal organic vapor phase epitaxy (MOVPE) for solar cell application," Proc. of SPIE, 2012, vol. 8256, 8 pages.
King et al., "High-Voltage, Low-Current GaInP/GaInP/GaAs/GaInNAs/Ge Solar Cells" Spectrolab Inc., 2002, pp. 852-855.
King et al., "40% Efficient Metamorphic GaInP/GaInAs/Ge Multijunction Solar Cells," J. of Applied Physics Letters, May 4, 2007.
Kudrawiec, "Contactless electroreflectance of GaInNAsSb/GaAs single quantum wells with indium content of 8%-32%", Jan. 2007, Journal of Applied Physics, vol. 101, pp. 013504-1-013504-9.
Kurtz et al., "Understanding the potential and limitations of dilute nitride alloys for solar cells", Paper No. NREL/CP-520-38998, DOE Solar Energy Technologies Conference, Denver, CO, Nov. 7-10, 2005, 5 pages.
Kurtz et al., "Projected Performance of Three and Four-Junction Devices Using GaAs and GaInP," pp. 875-878, 26th IEEE Photovoltaics Specialists Conference, 1997.
Law et al., "Future technology pathways of terrestrial III-V multijunction solar cells for concentrator photovoltaic systems," Solar Energy Materials & Solar Cells 94 (2010) pp. 1314-1318.
Loke, W.K. et al., "Improvement of GaInNAs p-i-n photodetector responsivity by antimony incorporation," Journal of Applied Physics, 2007, vol. 101, p. 033122.
Merrill et al, Directions and Materials Challenges in High Performance Photovoltaics, Dec. 2007, JOM Energetic Thin Films, 59, 12, p. 26-30.
Miller et al., "GaAs—AlGaAs tunnel junctions for multigap cascade solar cells", Journal of Applied Physics, vol. 53, No. 1, Jan. 1982, p. 744-748.
Miyashita et al., "Generation and collection of photocarriers in dilute nitride GaInNAsSb solar cells," Progress in Photovoltaics: Research and Applications, 2016, vol. 24, p. 28-37.
Miyashita et al., Effect of Indium Composition on GaInNAsSb Solar Cells Grown by Atomic Hydrogen-Assisted Molecular Beam Epitaxy, pp. 000632-000635, 978-1-4244-2950@ 2009 IEEE.
Miyashita et al., "Improvement of GaInNAsSb films fabricated by atomic hydrogen-assisted molecular beam epitaxy", pp. 3249-3251, Journal of Crystal Growth 311, 2009.
Miyashita, N. et al., "Characterization of 1.0 EV GaInNAsSb Solar Cells for Multijunction Applications and the Effect of Annealing," 31st European Photovoltaic Solar Energy Conference and Exhibition, Sep. 2015, p. 1461-1465.
NG et al., "Long wavelength bulk GaInNAs p-i-n photodiodes lattice matched to GaAs," Journal of Applied Physics, 2007, vol. 101, 6 pages.
NG et al., "Molecular beam epitaxy growth of bulk GaNAsSb on Ge/graded-SiGe/Si substrate," Journal of Crystal Growth, 2009, vol. 311, p. 1754-1757.
NG et al., 1EV GANXAS1-X-YSBY Material for Lattice-Matched III-V Solar Cell Implementation on GaAs and Ge, pp. 76-80, (2009).
Niu et al., "GaAs-based room-temperature continuous-wave 1.59um GaInNAsSb single-quantum-well laser diode grown by molecular-beam epitaxy," Applied Physics Letters, Dec. 2005, vol. 87, No. 23, 4 pages.
Ohnaka et al., "A Low Dark Current InGaAs/InP p-i-n Photodiode with Covered Mesa Structure," IEEE Transactions on Electron Devices, Feb. 1987, vol. Ed-34, No. 2, 6 pages.
Olson J.M. et al., "High-Efficiency III-V Multijunction Solar Cells" Handbook of Photovoltaic Science and Engineering, 1st ed.; Luque, A., Hegedus, S., Eds.; Wiley: New York, NY, USA, 2003; Chapter 9, pp. 359-411.
Patton et al., "Development of a High Efficiency Metamorphic Triple-junction 2.1 eV/1.6 eV/1.2 eV AlGaInP/InGaAsP/InGaAs Space Solar Cell", Conference Record of the IEEE Photovoltaic Specialists Conference, Institute of Electrical and Electronics Engineers Inc., May 19, 2002, vol. 29, p. 1027-1030.
Polojarvi et al., "Comparative study of defect levels in GaInNAs, GaNAsSb, and GaInNAsSb for high-efficiency solar cells," Applied Physics Letters, 2016, vol. 108, p. 122104.
Ptak et al., "A comparison of MBE- and MOCVD-grown GaInNAs," Journal of Crystal Growth, 2003, vol. 251, p. 392-398.
Ptak et al., "Effects of Temperature, Nitrogen Ions and Antimony on Wide Depletion Width GaInNAs," pp. 955-959.J. Vac. Sci. Tech. B25(3), May/Jun. 2007.
Ptak et al., "Low-acceptor-Concentration GaInNAs grown by Molecular-beam Epitaxy for High-current p-i-n solar cell applications." J. of Applied Physics, 98.094501 (2005).
Ptak et al., "Defects in GaInNAs: What We've Learned so Far" National Renewable Energy Laboratory NREL/CP-520-33555, May 2003, 7 pages.
Sabnis et al., A new roadmap for space solar cells, Industry Photovoltaics, www.compoundsemiconductor.net/csc/features-details/19735471, Aug./Sep. 2012, 5 pages.
Schubert et al., "High-Voltage GaAs Photovoltaic Laser Power Converters", IEEE transactions on Electron Devices, Feb. 2009, vol. 56, No. 2, p. 170-175.
Sin et al., "Carrier Dynamics in MOVPE-Grown Bulk Dilute Nitride Materials for Multi-Junction Solar Cells," Proc. of SPIE, 2011, vol. 7933, 11 pages.
Solar Junction Inc., "Sharp Develops Solar Cell with Word's Highest Conversion Efficiency of 35.8%" Press Release, dated Oct. 22, 2009, 3 pages.
Takeda et al., "Electron mobility and energy gap of In0.53 Ga0.47As on InP substrate," Journal of Applied Physics, Dec. 1976, vol. 47, No. 12, p. 5405-5408.
Tan et al., "Reduction of dark current and unintentional background doping in InGaAsN photodetectors by ex situ annealing," Proc. of SPIE, 2010, vol. 7726, 8 pages.
Tan et al., "Molecular beam epitaxy grown GaNAsSb 1 eV photovoltaic cell," Journal of Crystal Growth, 2011, vol. 335, p. 66-69.
Tan et al., GaInNAsSb/GaAs Photodiodes for Long-Wavelength Applications, IEEE Electron Device Letters, Jul. 2011, vol. 32, No. 7, 3 pages.
Tan et al., "Dilute nitride GaInNAs and GaInNAsSb for solar cell applications," Proc. of SPIE, 2012, vol. 8256, 10 pages.
Trotta, R. et al., "Hydrogen diffusion in GaAs1-xNx," The American Physical Society Review, 2009, vol. 80, p. 195206.
Volz et al., Optimization of Annealing Conditions of (GaIn)(NAs) for Solar Cell Applications, pp. 2222-2228, Journal of Crystal Growth 310 (2008).

(56) References Cited

OTHER PUBLICATIONS

Volz et al., MOVPE growth of dilute nitride III/V semiconductors using all liquid metalorganic precursors, Journal of Crystal Growth 311 (2009), pp. 2418-2526.
Wiemer et al., "43.5% Efficient Lattice Matched Solar Cells" Proc. SPIE 810804, High and Low Concentrator Systems for Solar Electric Applications VI (Sep. 19, 2011).
Wistey et al., "Monolithic, GaInNAsSb VCSELs at 1.46um on GaAs by MBE," Electronics Letters, Dec. 2003, vol. 39, No. 25, 2 pages.
Wistey et al., Nitrogen Plasma Optimization for High-Quality Dilute Nitrides, pp. 229-233, Journal of Crystal Growth, available online on Feb. 1, 2005 at http://www.sciencedirect.com.
Wu et al., Band Anticrossing in Highly Mismatched III-V Semiconductor Alloys, pp. 860-869, Semiconductor Science and Technology 17 (2002).
Xin et al., "Effects of hydrogen on doping of GaInNAs grown by gas-source molecular beam epitaxy," Journal of Vacuum Science and Technology, 2000, vol. 18, p. 1476-1479.
Yamaguchi et al., "Multi-junction III-V solar cells: current status and future potential", in: Solar Energy, vol. 79, issue 1, Jul. 2005.
Yu et. al., Mutual Passivation of Group IV Donors and Nitrogen in Diluted $GaN_xAs_{1-x}$ Alloys, pp. 2844-2846, Applied Physics Letters, vol. 83, No. 14 (Oct. 6, 2003).
Yuen, "Growth and Characterization of Dilute Nitride Antimonides for Long-Wavelength Optoelectronics," a dissertation submitted to the department of materials science and engineering and the committee on graduate studies of Stanford University in partial fulfillment of the requirements for the degree of doctor of philosophy, Mar. 2006, 203 pages.
Yuen, "The role of antimony on properties of widely varying GaInNAsSb compositions", Journal of Applied Physics, May 2006, vol. 99, p. 093504-1 to 093804-8.
E. Wesoff, "Update: Solar Junction breaking CPV efficiency records, raising $30M", Greentech Media, Apr. 15, 2011, 4 pages.
E. Wesoff, "CPV Roundup: SolFocus funding, 5MW order for Solar Junction, GreenVolts, Amonix", Greentech Media, May 22, 2012, 3 pages.
E. Wesoff, "Record 44 percent CPV efficiency from startup Solar Junction", Greentech Media, Oct. 15, 2012, 3 pages.
Weyers et al., "Red shift of photoluminescence and absorption in dilute GaAsN alloy layers", Japan Journal of Applied Physics, vol. 31, Issue 7A, 1992, p. L853-L855.
International Search Report and Written Opinion PCT/US2008/008495 dated Apr. 6, 2009, 5 pages.
International Preliminary Report on Patentability PCT/US2008/008495 dated Jan. 12, 2010, 5 pages.
International Search Report and Written Opinion corresponding to the PCT application No. PCT/US10/39534, dated Sep. 8, 2010, 8 pages.
International Search Report and Written Opinion corresponding to the PCT application No. PCT/US10/56800, dated Jan. 26, 2011, 8 pages.
International Search Report and Written Opinion corresponding to the PCT application No. PCT/US2010/061635 , dated Mar. 1, 2011 , 7 pages.
International Search Report and Written Opinion corresponding to the PCT application No. PCT/US11/36486, dated Aug. 25, 2011,12 pages.
International Preliminary Report on Patentability for PCT Application No. PCT/US2010/056800, dated May 31, 2012, 6 pages.
International Search Report and Written Opinion of the International Searching Authority for PCT Application No. PCT/US 12/36020, dated Aug. 14, 2012, 11 pages.
International Search Report and Written Opinion of the International Searching Authority for PCT Application No. PCT/US 12/25307, dated Aug. 16, 2012, 13 pages.
International Search Report and Written Opinion corresponding to PCT Application No. PCT/US2015/014650, dated May 20, 2015, 13 pages.
International Preliminary Report on Patentability for Application No. PCT/US2015/014650, dated Aug. 9, 2016, 21 pages.
International Search Report and Written Opinion for PCT Application No. PCT/US2013/033567, dated Mar. 4, 2014, 12 pages.
International Search Report and Written Opinion for PCT Application No. PCT/US2016/038567, dated Jun. 21, 2016, 15 pages.
Written Opinion for Singapore Application No. 11201606353T, dated Aug. 16, 2017, 6 pages.
Non-Final Office Action dated Jun. 10, 2010 for U.S. Appl. No. 12/217,818, 15 pages.
Final Office Action dated Jan. 1, 2011 for U.S. Appl. No. 12/217,818, 15 pages.
Non-Final Office Action dated Feb. 13, 2013 for U.S. Appl. No. 12/819,534, 8 pages.
Final Office Action dated Sep. 9, 2013 for U.S. Appl. No. 13/819,534, 13 pages.
Non-Final Office Action for U.S. Appl. No. 12/819,534, dated Sep. 16, 2015, 10 pages.
Non-Final Office Action dated Oct. 5, 2012 for U.S. Appl. No. 12/944,439, 15 pages.
Final Office Action dated May 29, 2013 for U.S. Appl. No. 12/944,439, 17 pages.
Non-Final Office Action for U.S. Appl. No. 12/944,439, dated Aug. 13, 2014, 11 pages.
Non-Final Office Action dated Oct. 24, 2012 for U.S. Appl. No. 12/749,076, 17 pages.
Non-Final Office Action dated May 24, 2013 for U.S. Appl. No. 13/739,989, 7 pages.
Non-Final Office Action dated Dec. 14, 2012 for U.S. Appl. No. 13/618,496, 16 pages.
Final Office Action dated Feb. 6, 2013 for U.S. Appl. No. 13/618,496, 8 pages.
Notice of Allowance dated Mar. 22, 2013 for U.S. Appl. No. 13/618,496, 8 pages.
Amendment, Affidavits under 37 C.F.R. §132, and Information Disclosure Statement filed Nov. 2013 for U.S. Appl. No. 13/739,989, 51 pages.
Final Office Action dated Feb. 26, 2014, for U.S. Appl. No. 13/739,989, 16 pages.
Notice of Allowance for U.S. Appl. No. 13/739,989, dated Sep. 30, 2014, 9 pages.
Declaration Under 37 C.F.R. § 1.132 of Homan Yuen filed for U.S. Appl. No. 13/739,989 on Nov. 15, 2013, pp. 1-10.
Declaration Under 37 C.F.R. § 1.132 of Jerry Olson filed for U.S. Appl. No. 13/739,989 on Nov. 15, 2013, pp. 1-5.
Declaration Under 37 C.F.R. § 1.132 of Minjoo Lee filed for U.S. Appl. No. 13/739,989 on Nov. 15, 2013, pp. 1-6.
Notice of Allowance for U.S. Appl. No. 14/512,224, dated Jan. 30, 2015, 8 pages.
Notice of Allowance for U.S. Appl. No. 14/678,737, dated Oct. 27, 2015, 18 pages.
Non-Final Office Action for U.S. Appl. No. 14/678,737, dated Jul. 6, 2015, 13 pages.
Non-Final Office Action dated Feb. 15, 2013 for U.S. Appl. No. 12/914,710, 14 pages.
Final Office Action dated Sep. 6, 2013 for U.S. Appl. No. 12/914,710, 17 pages.
Notice of Allowance for U.S. Appl. No. 14/914,710, dated Sep. 25, 2015, 13 pages.
Non-Final Office Action dated Dec. 31, 2013, for U.S. Appl. No. 13/370,500, 7 pages.
Notice of Allowance for U.S. Appl. No. 13/370,500, dated Sep. 22, 2014.
Non-Final Office Action dated Nov. 8, 2012 for U.S. Appl. No. 13/104,913, 12 pages.
Notice of Allowance for U.S. Appl. No. 13/104,913, dated Feb. 21, 2014, 8 pages.
Final Office Action dated Oct. 2, 2013 for U.S. Appl. No. 13/104,913, 12 pages.
Non-Final Office Action dated Apr. 15, 2013 for U.S. Appl. No. 12/708,763, 23 pages.
Non-Final Office Action dated Apr. 25, 2013 for U.S. Appl. No. 13/708,791, 16 pages.

(56) References Cited

OTHER PUBLICATIONS

Non-Final Office Action for U.S. Appl. No. 13/678,389, dated Feb. 20, 2014, 13 pages.
Non-Final Office Action for U.S. Appl. No. 13/678,389, dated Jul. 6, 2015, 11 pages.
Final Office Action for U.S. Appl. No. 13/678,389, dated Oct. 10, 2014, 15 pages.
Notice of Allowance for U.S. Appl. No. 13/708,763, dated Feb. 20, 2014, 9 pages.
Final Office Action dated Oct. 1, 2013 for U.S. Appl. No. 13/708,791, 15 pages.
Notice of Allowance for U.S. Appl. No. 13/708,791, dated Oct. 31, 2014.
Non-Final Office Action for U.S. Appl. No. 13/894,245, dated Jun. 24, 2015, 19 pages.
Notice of Allowance for U.S. Appl. No. 13/442,146, dated Jul. 7, 2015, 7 pages.
Non-Final Office Action dated Mar. 21, 2014, for U.S. Appl. No. 13/442,146, 6 pages.
Non-Final Office Action for U.S. Appl. No. 14/614,601, dated Jan. 23, 2017, 11 pages.
Baranowski et al., "Time-resolved photoluminescence studies of annealed 1.3-um GaInNAsSb quantum wells," Nanoscale Research Lettesr, 2014, vol. 9, No. 81, 5 pages.
Dargis et al., "Monolithic integration of rare-earth oxides and semiconductors for on-silicon technology," J. Vac. Sci. Tech., Aug. 2014, vol. 32, No. 4, p. 041506.
Fitzgerald et al., "Dislocations in Relaxed SiGe/Si Heterostructures," Phys. Stat. Sol., 1999, vol. 171, p. 227-238.
Han et al., "1.55 um GaInNAs resonant-cavity-enhanced photodetector grown on GaAs," Applied Physics Letters, 2005, vol. 87, 111105.
Heroux et al., "GaInNAs resonant-cavity-enhanced photodetector operating at 1.3 um," Applied Physics Letters, Nov. 1999, vol. 75, No. 18, p. 2716-2718.
Ketlhwaafetse, Richard, "Comparative Study of Dilute Nitride and Bismide Sub-Junctions for Tandem Solar Cells," A thesis for Ph.D. in applied physics, University of Essex, Jan. 2016, 175 pages.
Kim et al., "Characteristics of bulk InGaAsSbN/GaAs grown by metalorganic vapor phase epitaxy (MOVPE)," Journal of Crystal Growth, 2013, p. 163-167.
Kudrawiec et al., "Band Gap Discontinuity in Ga0.9In0.1N0.027As0.973-xSbx/GaAs Single Quantum Wells with 0<x<0.06 Studied by Contactless Electroreflectance Spectroscopy", Applied Physics Letters, 2006, vol. 88, p. 221113.
Le Du et al., "Quantum-well saturable absorber at 1.55 um on GaAs substrate with a fast recombination rate," Applied Physics Letters, 2006, vol. 88, 201110.
Ni et al., "Optimization of GaInNAs(Sb)/GaAs quantum wells at 1.3-1.55 um grown by molecular beam epitaxy," Journal of Crystal Growth, 2007, vol. 301-302, p. 125-128.
Ochoa, M. et al., "Advances Towards 4J Lattice-Matched including Dilute Nitride Subcell for Terrestrial and Space Applications," 43rd Photovoltaic Specialists Conference, 2016, p. 52-57.
Pena et al., "The Influence of Monolithic Series Connection on the Efficiency of GaAs Photovoltaic Converters for Monochromatic Illumination," Transactions on Electron Devices, Feb. 2001, vol. 48, No. 2, p. 196-203.
Tan et al., "Improved Optoelectronic Properties of Rapid Thermally Annealed Dilute Nitride GaInNAs Photodetectors," Journal of Electronic Materials, 2012, vol. 41, No. 12, p. 3393-3401.
Tan et al., "High responsivity GaNAsSb p-i-n photodetectors at 1.3um growth by radio-frequency nitrogen plasma-assisted molecular beam epitaxy," Optics Express, May 2008, vol. 16, No. 11, p. 7720-7725.
Tan et al., "Experimental evaluation of impact ionization in dilute nitride GaInNAs diodes," Applied Physics Letters, 2013, vol. 103, p. 102101.
Tukiainen, A. et al., "High-efficiency GaInP/GaAs/GaInNAs solar cells grown by combined MBE-MOCVD technique," Progress in Photovoltaics, Research and Applications, May 2016, vol. 24, p. 914-919.
Unlu, M.S., "Resonant cavity enhanced photonic devices," Journal of Applied Physics Reviews, American Institute of Physics, Jul. 1995, vol. 76, p. 607-632.
Wicaksono et al., "Effect of growth temperature on defect states of GaAsSbN intrinsic layer in GaAs/GaAsSbN/GaAs photodiode for 1.3 um application," Journal of Applied Physics, 2007, vol. 102, p. 044505.
Wilkins, M., "Multi-junction solar cells and photovoltaic power converters: high-efficiency designs and effects of luminescent coupling," Ph.D. Dissertation, University of Ottawa, Jun. 2017, 152 pages.
International Search Report and Written Opinion for PCT Application No. PCT/US2018/039544, dated Sep. 10, 2018, 15 pages.
Non-Final Office Action for U.S. Appl. No. 16/051,109, dated Sep. 25, 2018, 11 pages.
Campesato, Roberta, et al., "31% European InGaP/GaAs/InGaNAs Solar Cells for Space Application", Proceedings of the 11th European Space Power Conference 2016 (ESPC 2016), Published May 23 2017, 5 pages.
Miyashita, N., et al., "Incorporation of Hydrogen into MBE-Grown Dilute Nitride GaInNAsSb Layers in a MOCVD Growth Ambient", Solar Energy Materials and Solar Cells, vol. 185, 2018, pp. 359-363.
Suarez, F., et al., "Advances in Dilute Nitride Multi-Junction Solar Cells for Space Power Applications", Proceedings of the 11th European Space Power Conference 2016 (ESPC 2016), Published May 23 2017, 3 pages.
Aho., "Dilute Nitride Multijunction Solar Cells Grown by Molecular Beam Epitaxy," Ph.D. Dissertation, Tampere University of Technology, Nov. 2015, vol. 1343, p. 44.
Campesato et al., "31% European InGaP/GaAs/InGaNAs Solar Cells for Space Application," E3S Web of Conferences, 2017, vol. 16, 5 pages.
Garcia et al., "Degradation of subcells and tunnel junctions during growth of GaInP/Ga(In)As/GaNAsSb/Ge 4-junction solar cells," Progress in Photovoltaics, Aug. 2017, 9 pages.
Thomas, Daniel Tomos. "Investigation of material and device properties of GaAsSbN for multi-junction solar cell applications," Jun. 2017, Thesis, Imperial College London, Department of Physics, 25 pages.
Aho, Arto, "Dilute Nitride Multijunction Solar Cells Grown by Molecular Beam Epitaxy", PhD Dissertation, Tampere University of Technology, Publication, vol. 1343, Nov. 14, 2015, XP055524070, pp. 1-80.
Baghdasaryan, H.V. et al., "Wavelength-Scale Analysis of Influence of Chirped DBRs on Optical Characteristics of Multinanolayer Photovoltaic Cells," ICTON 2016, We.P.33, 5 pages.
Chang, S.J. et al., "Chirped GaAs—AlAs Distributed Bragg Reflectors for High Brightness Yellow-Green Light-Emitting Diodes," Photonics Technology Letters, Feb. 1997, vol. 9, No. 2, p. 182-184.
Garcia, I. et al., "Design of Semiconductor-Based Back Reflectors for High Voc Monolithic Multijunction Solar Cells," IEEE Photovoltaic Specialists Conference, Austin Texas, Jun. 3-8, 2012, 8 pages.
Huang, Jie et al., "Four-junction AlGaAs/GaAs laser power converter," Journal of Semiconductors, Apr. 2018, vol. 39, No. 4, 044003, 5 pages.
Saka, T. et al., "Bragg reflector of GaAlAs/AlAs layers with wide bandwidth applicable to light emitting diodes," Journal of Applied Physics, 1993, vol. 73, No. 380, p. 380-383.
Thomas, Tomos Daniel, "Investigation of Material and Device Properties of GaAsSbN for Multi-Junction Solar Cell Applications", Thesis, Jun. 6, 2017, XP055524108, pp. 1-188.
Tobin, S.P. et al., "Enhanced Light Absorption in GaAs Solar Cells with Internal Bragg Reflectors," IEEE Photovoltaic Specialists Conference, Oct. 1991, p. 147-152.
Tukiainen, A., et al., "Improving the current output of GaInNAs solar cells using distributed Bragg reflectors," IEEE 43rd Photovoltaic Specialists Conference, Jun. 2016, 4 pages.

(56) References Cited

OTHER PUBLICATIONS

Yoon, Soon F., et al., "Recent Progress in Dilute Nitride-Antimonide Materials for Photonic and Electronic Applications", ECS Transactions, 2009, XP055524397, pp. 5-29.
International Search Report and Written Opinion for PCT Application No. PCT/US2018/052873, dated Nov. 22, 2018, 12 pages.
Non-Final Office Action for U.S. Appl. No. 16/051,109, dated Oct. 30, 2018, 11 pages.
Final Office Action for U.S. Appl. No. 16/051,109, dated Feb. 1, 2019, 11 pages.
International Search Report and Written Opinion for PCT Application No. PCT/US2019/021598, dated Jun. 14, 2019, 13 pages.
David et al., "Material Considerations for Avalanche Photodiodes," IEEE Journal of Selected Topics in Quantum Electronics, Jul./Aug. 2008, vol. 14, No. 4, p. 998-1009.
Heroux et al., "Dilute Nitride Photodetector and Modulator Devices," Dilute III-V Nitride Semiconductors and Material Systems, Materials Science, Jan. 2008, vol. 105, pp. 563-586.
Kinsey et al., "GaNAs resonant-cavity avalanche photodiode operating at 1.064 um," Applied Physics Letters, Sep. 2000, vol. 77, No. 10, p. 1543-1544.
Mawst et al., "Dilute-Nitride-Antimonide Materials Grown by MOVPE for Multi-Junction Solar Cell Application," The Electrochemical Society, 2015, vol. 66, No. 7, p. 101-108.
NG et al., "InGaAsN as Absorber in APDs for 1.3 micron Wavelength Applications," Indium Phosphide & Related Materials, 2010 International Conference, May 2010, p. 1-4.
International Search Report and Written Opinion for PCT Application No. PCT/US2019/036857, dated Aug. 23, 2019, 18 pages.
Examination Report for European Application No. 15704681.4, dated Sep. 3, 2019, 7 pages.
Edmund. "Dichroic Longpass Filters", Edmund Optics Worldwide, Product Catalog, Feb. 2001, 9 pages, retrieved from https://www.edmundoptics.com/t/dichroic-longpass-filters/14288/.
Langer et al., "Graded band gap GaInNAs solar cells", Applied Physics Letters, 2015, vol. 106, p. 233902.
Magden et al., "Transmissive silicon photonic dichroic filters with spectrally selective waveguides", Nature Communications, Aug. 2018, 10 pages, retrieved from https://www.nature.com/articles/s41467-018-05287-1.
Thorlabs. "Longpass Dichroic Mirrors/Beamsplitters", Product Description, Sep. 29, 2008, 15 pages, retrieved from https://www.thorlabs.com/newgrouppage9.cfm?objectgroup_Id=3313.
International Search Report for PCT Application No. PCT/US2019/048533, dated Jan. 2, 2020, 10 pages.

* cited by examiner

| Layer Name | Layer Function | |
|---|---|---|
| InGaAs | InGaAs Contact | 336 |
| InAlP | FSF (Front Surface Field) | 334 |
| AlGaInP | Emitter | 332 |
| AlGaInP | Base | 330 |
| AlGaInP | BSF (Back Surface Field) | 328 |
| AlGaAs | Tunnel Junction | 326 |
| GaAs | Tunnel Junction | 326 |
| AlGaInP | FSF (Front Surface Field) | 324 |
| AlGaAs | Emitter | 322 |
| AlGaAs | Base | 320 |
| AlGaAs or other Al-layer | BSF (Back Surface Field) and Hydrogen Barrier | 318 |
| InGaAs | Tunnel Junction and Protective Cap Layer | 316 |
| InGaAs | Tunnel Junction | 316 |
| InGaAs | Emitter | 314 |
| GaInNAsSb | Base | 312B |
| GaInNAsSb | Base | 312A |
| InGaAs | BSF (Back Surface Field) | 310 |
| InGaAs | Tunnel Junction 308B | 308 |
| InGaAs | Tunnel Junction 308A | 308 |
| InGaAs | Buffer Layer | 306 |
| InGaP | Nucleation Layer | 304 |
| (Se,Sn) Ge | Substrate, Base | 302 |

305: layers 328–334
303: layers 318–324
301: layers 310–314

FIG. 3A

| Layer Name | Layer Function | |
|---|---|---|
| InGaAs | InGaAs Contact | 336 |
| InAlP | FSF (Front Surface Field) | 334 |
| AlGaInP | Emitter | 332 |
| AlGaInP | Base | 330 |
| AlGaInP | BSF (Back Surface Field) | 328 |
| AlGaAs | Tunnel Junction | 326 |
| GaAs | Tunnel Junction | 326 |
| AlGaInP | FSF (Front Surface Field) | 324 |
| AlGaAs | Emitter | 322 |
| AlGaAs | Base | 320 |
| AlGaAs or other Al-layer | BSF (Back Surface Field) | 318 |
| InGaAs/GaAs | Reflector and Hydrogen Barrier | 307 |
| InGaAs | Tunnel Junction and Protective Cap Layer | 316 |
| InGaAs | Tunnel Junction | 316 |
| InGaAs | Emitter | 314 |
| GaInNAsSb | Base | 312B |
| GaInNAsSb | Base | 312A |
| InGaAs | BSF (Back Surface Field) | 310 |
| InGaAs | Tunnel Junction 308B | 308 |
| InGaAs | Tunnel Junction 308A | 308 |
| InGaAs | Buffer Layer | 306 |
| InGaP | Nucleation Layer | 304 |
| (Se,Sn) Ge | Substrate, Base | 302 |

Groupings: 305 {336–328}, 303 {324–318}, 301 {314–310}

FIG. 3B

| Layer Name | Layer Function | |
|---|---|---|
| InGaAs | InGaAs Contact | 336 |
| InAlP | FSF (Front Surface Field) | 334 |
| AlGaInP | Emitter | 332 |
| AlGaInP | Base | 330 |
| AlGaInP | BSF (Back Surface Field) | 328 |
| AlGaAs | Tunnel Junction | 326 |
| GaAs | Tunnel Junction | 326 |
| AlGaInP | FSF (Front Surface Field) | 324 |
| AlGaAs | Emitter | 322 |
| AlGaAs | Base | 320 |
| AlGaAs or other Al-layer | BSF (Back Surface Field) | 318 |
| InGaAs | Tunnel Junction and Protective Cap Layer | 316 |
| InGaAs | Tunnel Junction | 316 |
| AlGaAs or other Al-layer | Window and Hydrogen Barrier | 309 |
| InGaAs | Emitter | 314 |
| GaInNAsSb | Base | 312B |
| GaInNAsSb | Base | 312A |
| InGaAs | BSF (Back Surface Field) | 310 |
| InGaAs | Tunnel Junction 308B | 308 |
| InGaAs | Tunnel Junction 308A | 308 |
| InGaAs | Buffer Layer | 306 |
| InGaP, InGaPSb, or InAlP | Nucleation Layer | 304 |
| (Se,Sn) Ge | Substrate, Base | 302 |

Layers 305, 303, 301 bracket groups as shown.

FIG. 3C

| Layer Name | Layer Function | |
|---|---|---|
| InGaAs | InGaAs Contact | 336 |
| InAlP | FSF (Front Surface Field) | 334 |
| AlGaInP | Emitter | 332 |
| AlGaInP | Base | 330 |
| AlGaInP | BSF (Back Surface Field) | 328 |
| AlGaAs | Tunnel Junction | 326 |
| GaAs | Tunnel Junction | |
| AlGaInP | FSF (Front Surface Field) | 324 |
| AlGaAs | Emitter | 322 |
| AlGaAs | Base | 320 |
| AlGaAs or other Al-layer | BSF (Back Surface Field) | 318 |
| InGaAs | Tunnel Junction and Protective Cap Layer | 316 |
| InGaAs | Tunnel Junction | |
| AlGaAs or other Al-layer | Emitter | 315 |
| GaInNAsSb | Base | 312B |
| GaInNAsSb | Base | 312A |
| InGaAs | BSF (Back Surface Field) | 310 |
| InGaAs | Tunnel Junction 308B | 308 |
| InGaAs | Tunnel Junction 308A | |
| InGaAs | Buffer Layer | 306 |
| InGaAs | Nucleation Layer | 304 |
| (Se,Sn) Ge | Substrate, Base | 302 |

Groupings: 305 spans 334–328; 303 spans 324–318; 301 spans 315–310.

FIG. 3D

Test Structures:

| 4-1 | 4-2 | 4-3 | 4-4 |
|---|---|---|---|
| MOCVD-grown (In)GaAs | MOCVD-grown (In)GaAs | MOCVD-grown (In)GaAs | |
| MBE-grown dilute nitride | MBE-grown dilute nitride | MBE-grown dilute nitride | MBE-grown dilute nitride |
| MBE-grown Ge | MBE-grown Ge | MBE-grown Ge | MBE-grown Ge |

| | | | |
|---|---|---|---|
| RTA before MOCVD | Yes | No | No | Yes |
| RTA after MOCVD | No | Yes | No | No |

FIG. 4

Test Structures:

| | 6-1 | 6-2 | 6-3 |
|---|---|---|---|
| | MBE-grown dilute nitride / MBE-grown Ge | MBE-grown dilute nitride / MBE-grown Ge | MBE-grown dilute nitride / MBE-grown Ge |

| RTA before MOCVD | Yes | Yes | Yes |
|---|---|---|---|
| MOCVD Thermal Simulation | No | Yes | Yes |
| MOCVD Environment | N/A | Nitrogen | Arsine |

FIG. 6

Test Structures:

| | 8-1 | 8-2 |
|---|---|---|
| | Al barrier | Al barrier |
| | MBE-grown dilute nitride | MBE-grown dilute nitride |
| | MOCVD-grown Ge | MOCVD-grown Ge |
| Dilute Nitride with Aluminium Barrier, grown by MBE | 40% Al, 200 nm | 40% Al, 200 nm |
| MOCVD Thermal Simulation | Yes | Yes |
| MOCVD Environment | Nitrogen | Arsine |

FIG. 8

| Test Structures: | 10-1 | 10-2 | 10-3 |
|---|---|---|---|
| | MBE-grown J1 | MOCVD-grown J1 | MOCVD-grown J1 |
| | MBE-grown J2 | MOCVD-grown J2 | MOCVD-grown J2 |
| | MBE-grown Al Barrier | MBE-grown Al Barrier | MBE-grown Al Barrier |
| | MBE-dilute nitride | MBE-dilute nitride | MBE-dilute nitride |
| | MBE-grown J4 | MOCVD-grown J4 | MOCVD-grown J4 |
| Epitaxial Method | MBE | MOCVD and MBE | MOCVD and MBE |
| Post Epitaxy Thermal Treatment | No | No | Yes |

FIG. 10

HYBRID MOCVD/MBE EPITAXIAL GROWTH OF HIGH-EFFICIENCY LATTICE-MATCHED MULTIJUNCTION SOLAR CELLS

This application claims the benefit under 35 U.S.C. § 119(e) of U.S. Provisional Application No. 62/529,214, filed on Jul. 6, 2017, which is incorporated by reference in its entirety.

FIELD

The present invention relates to semiconductor devices and to methods of fabricating semiconductor devices having a dilute nitride layer and at least one semiconductor material overlying the dilute nitride layer. Particularly, the present invention relates to hybrid epitaxial growth of high-efficiency multijunction solar cells.

BACKGROUND

Epitaxial growth of III-V materials is a cornerstone technology for the wireless, optical and photovoltaic industries. Structures such as pseudomorphic high electron mobility transistors (PHEMTs), heterojunction bipolar transistors (HBTs), vertical-cavity surface-emitting lasers (VCSELs) and multijunction solar cells require the purity and crystalline quality that only epitaxial growth can provide. Two technologies used to fabricate multijunction solar cells are molecular beam epitaxy (MBE) and metal-organic chemical vapor deposition (MOCVD, or metal-organic chemical vapor deposition, MOVPE, or organometallic vapor phase epitaxy, OMVPE).

Dilute nitrides are a class of III-V semiconductor alloy materials (alloys having one or more elements from Group III in the periodic table along with one or more elements from Group V in the periodic table) with small fractions (less than about 7 atomic percent or 5 atomic percent, for example) of nitrogen). Dilute nitrides are of interest since they have a lattice constant that can be varied to be substantially matched to a broad range of substrates, including GaAs and germanium, and/or other semiconductor layers such as subcells for photovoltaic cells formed from materials other than dilute nitrides. The lattice constant can be controlled by the relative fractions of the different group IIIA and group VA elements. Thus, by tailoring the compositions (i.e., the elements and quantities) of a dilute nitride material, a wide range of lattice constants and band gaps may be obtained. Further, high quality material may be obtained by optimizing the composition around a specific lattice constant and band gap, while limiting the total antimony content to no more than 20 percent of the Group V lattice sites, such as to no more than 3 percent of the Group V lattice sites, or to no more than 1 percent of the Group V lattice sites.

Although metamorphic structures for III-V multijunction photovoltaic cells can be used, lattice-matched dilute nitride structures are preferred due to band gap tunability and lattice constant matching, making dilute nitrides ideal for integration into multijunction photovoltaic cells with substantial efficiency improvements. Dilute nitrides have proven performance reliability and require less semiconductor material in manufacturing. The high efficiencies of dilute nitride photovoltaic cells make them attractive for terrestrial concentrating photovoltaic systems and for photovoltaic systems designed to operate in space. Dilute nitrides are also of interest for photonic devices such as photodetectors and semiconductor lasers such as VCSELs. Significantly, thermal treatment is an essential and unique step in the fabrication of dilute nitride devices, which is not required for conventional semiconductors. A thermal load is required to ameliorate structure defects within the dilute nitride material.

Although MOCVD is a preferred technology in solar cell commercial production, plasma-assisted MBE is used for growing dilute nitride materials having a band gap of about 1 eV. It is difficult to incorporate a sufficient mole fraction of nitrogen by MOCVD into the lattice of epilayers. Plasma-assisted MBE offers superior dilute nitride composition control and material quality, in part because the process is able to produce more nitrogen radicals, which increases nitrogen incorporation in the semiconductor layers to reduce the band gap within a range from about 0.7 eV to 1.2 eV. Other junctions in a multijunction solar cell (e.g., (Al)GaAs, (Al)(In)GaP) can be grown by either MBE or MOCVD with comparable performance and quality.

MBE growth occurs on a heated substrate in an ultra-high vacuum (UHV) environment (with a base pressure of about 1E-9 Torr) typically using elemental sources without a carrier gas. The UHV environment ensures material purity. Layered structures are achieved by shuttering.

MOCVD growth occurs on a heated substrate in a totally different pressure regime than MBE (typically 15 Torr to 750 Torr). Unlike MBE, MOCVD uses complex compound sources, namely metal-organic sources (e.g., tri-methyl Ga, In, Al, etc.), hydrides (e.g., $AsH_3$, etc.), and other gas sources (e.g., disilane). In MOCVD, the reactants are flowed across the substrate where they react with the surface resulting in epitaxial growth. In contrast to MBE, MOCVD requires the use of a carrier gas (typically hydrogen) to transport reactants across the substrate surface. Layered structures are achieved by valve actuation for differing injection ports of a gas manifold. Maintenance of the MOCVD is much more frequent than for MBE but less time consuming. Therefore, MOCVD is able to recover more quickly from equipment failures or reconfiguration. MBE, on the other hand, involves longer maintenance periods and has setup variability limitations, for example, when growing phosphorous-containing epitaxial layers. MOCVD is the preferred technology in commercial production due to lower operational costs.

Hydrogen gas is often used as a carrier for arsenide and phosphide growth, and therefore semiconductor materials grown by MOCVD can be unintentionally doped with hydrogen. During epitaxy, hydrogen gas can arise from (1) the hydrogen gas carrier itself, and (2) through cracking of arsine or phosphine at the semiconductor surface, during which covalent bonds are broken and hydrogen is released. In contrast, MBE epitaxy uses solid or plasma sources without carrier gases, which eliminates complications resulting from the presence of hydrogen in the reactor. Once epiwafers are transferred from a low-hydrogen (MBE) environment to a hydrogen-rich (MOCVD) environment, hydrogen gas can diffuse into MBE-grown semiconductor layers and cause passivation-compensation and/or introduce isolated donor or defects in these layers, for example, complex defects of nitrogen and hydrogen, such as N—H and N—H—$V_{Ga}$ (where $V_{Ga}$ is associated with gallium vacancies). Unintentional hydrogen doping will contaminate and degrade a dilute nitride layer purposely grown at slow rates in the ultra-high vacuum MBE. Each epitaxial growth technique has its specific merits in specific device applications. For this reason, a new and improved MOCVD/MBE hybrid epitaxial growth technique and structure was designed to harness the benefits and mitigate the down-sides of both techniques.

Successful implementation of MOCVD/MBE hybrid epitaxy requires proper protection of grown intermediate epitaxial layers so that the top surfaces of such layers remain pristine and "epi-ready" for overgrowth. Oxidation or contamination of the interface layers must be prevented to make hybrid growth viable. The layers should also reduce or prevent diffusion of hydrogen from MOCVD growth into underlying dilute nitride layers and should also be able to withstand thermal treatments used in dilute nitride epitaxial processing. Use of sacrificial layers as protective or cap layers to be etched away prior to subsequent growth steps is inefficient, especially in high-volume production.

SUMMARY

This disclosure describes the design of an epitaxial structure and growth schedule that minimizes surface contamination and defects as epitaxial growth is interrupted in one reactor (MBE or MOCVD) and then resumed in a different reactor. The structures and processes also mitigate the effects of diffusion of hydrogen from MOCVD growth into underlying MBE-grown dilute nitride layers.

Dilute nitride electronic devices described in this disclosure result from the successful implementation of the MOCVD/MBE hybrid growth method. High efficiency devices result from specific epitaxial structure design (e.g., layer thicknesses and doping profiles), growth conditions (e.g., temperatures during growth and idle times, as well as growth rates), and deliberate partial or full annealing of dilute nitride layers during the hybrid fabrication process with minimized degradation to other junctions (FIGS. 1A-1E). The MOCVD/MBE hybrid method can also be applied to non-solar opto-electronic/photonic devices that incorporate at least one dilute nitride layer, such as lasers, vertical-cavity surface-emitting lasers (VCSELs), detectors, and power converters.

According to the present invention, semiconductor devices comprise at least one aluminum-containing layer overlying a dilute nitride layer, wherein the dilute nitride layer has a background doping concentration less than $10^{16}$ $cm^{-3}$.

According to the present invention, methods of forming a semiconductor device according to the present invention comprise: depositing the least one aluminum-containing layer overlying the dilute nitride layer; and depositing at least one semiconductor layer overlying the at least one aluminum-containing layer, wherein the dilute nitride layer and the at least one aluminum-containing layer are deposited using molecular beam epitaxy (MBE) and the at least one semiconductor layer is deposited using metal-organic chemical vapor deposition (MOCVD).

According to the present invention, methods for forming semiconductor device comprise: depositing at least one aluminum-containing layer overlying a dilute nitride layer; and depositing at least one semiconductor layer overlying the at least one aluminum-containing layer, wherein the dilute nitride layer and the at least one aluminum-containing layer are deposited using molecular beam epitaxy (MBE) and the at least one semiconductor layer is deposited using metal-organic chemical vapor deposition (MOCVD), and wherein the dilute nitride layer has a background doping concentration less than $10^{16}$ $cm^{-3}$.

BRIEF DESCRIPTION OF THE DRAWINGS

Those skilled in the art will understand that the drawings described herein are for illustration purposes only. The drawings are not intended to limit the scope of the present disclosure.

FIGS. 3A-3D show summaries of the composition and function of certain layers that may be present in embodiments of 4J multijunction solar cells comprising AlInGaP/(Al)(In)GaAs/GaInNAsSb/Ge, according to the invention.

FIG. 4 shows schematics of test structures and thermal treatments applied to the respective test structures.

FIG. 6 shows schematics of test structures, epitaxial environments and thermal treatments applied to the respective test structures.

FIG. 8 shows schematics of test structures barrier layer structure and thermal treatments applied to the respective test structures.

FIG. 10 shows schematics of test structures and the growth methods and thermal treatments applied to the respective test structures.

DETAILED DESCRIPTION

Figure 1A:
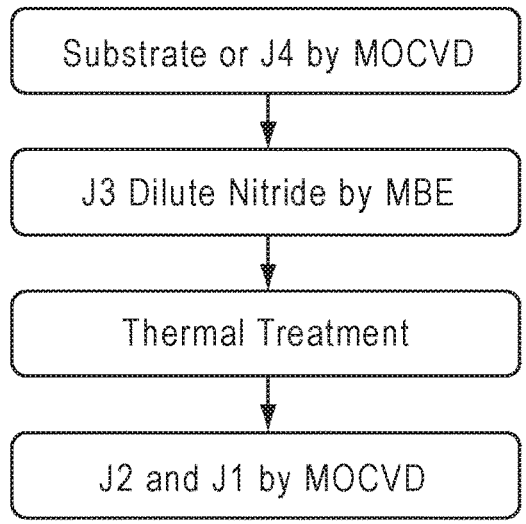
FIG. 1A-1E show process flow steps according to methods provided by the present disclosure.

The devices and methods of the present disclosure facilitate the manufacturing of high quality electronic and opto-electronic devices that result from successful implementation of MBE/MOCVD hybrid epitaxy. The devices and methods disclosed include details that pertain to dilute nitride multijunction solar cells.

The composition of a dilute nitride can be modified to achieve a wide range of lattice constants and band gaps. Examples include GaInNAsSb, GaInNAsBi, GaInNAsSbBi, GaNAsSb, GaNAsBi and GaNAsSbBi. High quality dilute nitride is obtained by tailoring the quantities of each element around a specific lattice constant and band gap, while limiting the total Sb content to no more than 20 percent of the Group V lattice sites, such as to no more than 3 percent of the Group V lattice sites, or to no more than 1 percent of the Group V lattice sites. Antimony, Sb, is believed to act as a surfactant that promotes smooth growth morphology of the III-AsNV alloys. In addition, Sb can facilitate uniform incorporation of nitrogen and minimize the formation of nitrogen-related defects. The incorporation of Sb into a III-AsNV alloy can enhance the overall nitrogen incorporation and reduce the alloy band gap, aiding the realization of lower band gap alloys. However, there are additional defects created by Sb and therefore it is desirable that the total concentration of Sb be limited to no more than 20 percent of the Group V lattice sites. Furthermore, the limit to the Sb content decreases with decreasing nitrogen content. Alloys that include In can have even lower limits to the total content because In can reduce the amount of Sb needed to tailor the lattice constant. For alloys that include In, the total Sb content may be limited to no more than 3 percent of the Group V lattice sites such as to no more than 1 percent of the Group V lattice sites. For example, $Ga_{1-x}In_xN_yAs_{1-y-z}Sb_z$, disclosed in U.S. Application Publication No. 2010/0319764, incorporated herein by reference, can produce a high-quality material when substantially lattice-matched to a GaAs or Ge substrate in the composition range of $0.08 \le x \le 0.18$, $0.025 \le y \le 0.04$ and $0.001 \le z \le 0.03$, with a band gap of at least 0.9 eV. Further examples of multijunction photovoltaic cells that have dilute nitride subcells are disclosed in U.S. Pat. No. 8,912,433, in U.S. Pat. No. 8,962,993, in U.S. Pat. No. 9,214,580, in U.S. Application Publication No. 2017/0110613, and in U.S. Application Publication No. 2017/0213922, each of which is incorporated by reference in its entirety, disclosing between them compositional ranges between $0 \le x \le 0.24$, $0.001 \le y \le 0.07$ and $0.001 \le z \le 0.2$, and with thicknesses between about 1 micron and 4 microns. In some examples, multijunction photovoltaic cells can comprise more than one dilute nitride subcell, with each subcell having a different elemental composition and bandgap.

Dilute nitride sub-cells having graded doping profiles are disclosed in U.S. Pat. No. 9,214,580, U.S. Application Publication No. 2016/0118526, and U.S. Patent Application No. 2017/0338357, each of which is incorporated by reference in its entirety. These applications describe dilute nitride base layers comprising an intentionally doped region with thicknesses between 0.4 microns and 3.5 microns, and with p-type doping levels between $1 \times 10^{15}$ cm$^{-3}$ and $1 \times 10^{19}$ cm$^{-3}$, and further comprising an intrinsic (or unintentionally doped) diluted nitride layer or an intentionally doped dilute nitride layer with a constant dopant concentration, having a thickness from 0.1 microns and about 1 micron, A doped region or doped layer refers to a region or doped layer that is intentionally doped. For example, a p-doped Ge layer refers to a Ge layer that has been intentionally doped with a p-type dopant. An intentionally doped layer has a concentration of the intentional dopant that is greater than the concentration of the dopant in the intrinsic material. An undoped material can have a concentration of dopants that are intrinsic to the deposition process and can result, for example, from impurities in the materials being deposited, background contaminants in the system, or dopants that are undesired artifacts of the deposition process. A material can have a concentration of an intrinsic dopant, for example, less than $10^{16}$ atoms/cm$^3$ or less than $10^{15}$ atoms/cm$^3$. A material can have a concentration of an intentional dopant, for example, greater than $10^{16}$ atoms/cm$^3$, greater than $10^{17}$ atoms/cm$^3$ or greater than $10^{18}$ atoms/cm$^3$.

Compositions for dilute nitride materials for photonic devices such as power converters and photodetectors are disclosed in U.S. Application Publication No. 2015/0221803, and in U.S. Provisional Application No. 62/564,124, filed on Sep. 9, 2017, each of which is incorporated by reference in its entirety.

All semiconductor layers in the structures disclosed can be lattice-matched to each of the other layers. "Lattice matched" refers to semiconductor layers for which the in-plane lattice constants of adjoining materials in their fully relaxed states differ by less than 0.6% when the materials are present in thicknesses greater than 100 nm. Further, subcells that are substantially lattice matched to each other means that all materials in the subcells that are present in thicknesses greater than 100 nm have in-plane lattice constants in their fully relaxed states that differ by less than 0.6%. In an alternative meaning, substantially lattice matched refers to the strain. As such, base layers can have a strain from 0.1% to 6%, from 0.1% to 5%, from 0.1% to 4%, from 0.1 to 3%, from 0.1% to 2%, or from 0.1% to 1%; or can have strain less than 6%, less than 5%, less than 4%, less than 3%, less than 2%, or less than 1%. Strain refers to compressive strain and/or to tensile strain. A lattice constant of a semiconductor layer can be determined by X-ray rocking curve analysis.

In certain embodiments of $Ga_{1-x}In_xN_yAs_{1-y-z}Sb_z$ provided by the present disclosure, the N composition is not more than 7 atom percent of the Group V lattice sites. In certain embodiments, the N composition is not more than 4 atom percent, and in certain embodiments, not more than 3 atom percent (at %), where percent is based on the total elemental content of the $Ga_{1-x}In_xN_yAs_{1-y-z}Sb_z$ alloy.

The present invention includes multijunction solar cells with three or more subcells such as three-, four- and five junction subcells incorporating at least one $Ga_{1-x}In_xN_yAs_{1-y-z}Sb_z$ subcell. The band gaps of the $Ga_{1-x}In_xN_yAs_{1-y-z}Sb_z$ materials can be tailored by varying the composition while controlling the overall content of Sb. Thus, a $Ga_{1-x}In_xN_yAs_{1-y-z}Sb_z$ subcell with a band gap suitable for integrating with the other subcells of a multijunction solar cell may be fabricated while maintaining substantial lattice-matching to the other subcells. The band gaps and compositions of the $Ga_{1-x}In_xN_yAs_{1-y-z}Sb_z$ subcells can be tailored so that the short-circuit current produced by the $Ga_{1-x}In_xN_yAs_{1-y-z}Sb_z$ subcells will be the same as or slightly greater than the short-circuit current of the other subcells in the solar cell. Because $Ga_{1-x}In_xN_yAs_{1-y-z}Sb_z$ materials provide high quality, lattice-matched and band gap-tunable subcells, the disclosed solar cells comprising $Ga_{1-x}In_xN_yAs_{1-y-z}Sb_z$ subcells can achieve high conversion efficiencies. The increase in efficiency is largely due to less light energy being lost as heat, as the additional subcells allow more of the incident photons to be absorbed by semiconductor materials with band gaps closer to the energy level of the incident photons. In addition, there will be lower series resistance losses in these multijunction solar cells compared with other solar cells due to the lower operating currents. At higher concentrations of sunlight, the reduced series resistance losses become more pronounced. Depending on the band gap of the bottom subcell, the collection of a wider range of photons in the solar spectrum may also contribute to the increased efficiency.

Designs of multijunction solar cells with more than three subcells in the prior art predominantly rely on metamorphic growth structures, new materials, or dramatic improvements in the quality of existing subcell materials in order to provide structures that can achieve high efficiencies. Solar cells containing metamorphic buffer layers may have reliability concerns due to the potential for dislocations originating in the buffer layers to propagate over time into the subcells, causing degradation in performance. In contrast, $Ga_{1-x}In_xN_yAs_{1-y-z}Sb_z$ materials can be used in solar cells with more than three subcells to attain high efficiencies while maintaining substantial lattice-matching between subcells, which is advantageous for reliability. For example, reliability testing on $Ga_{1-x}In_xN_yAs_{1-y-z}Sb_z$ subcells provided by the present disclosure has shown that multijunction solar cells comprise a $Ga_{1-x}In_xN_yAs_{1-y-z}Sb_z$ subcell, such devices can survive the equivalent of 390 years of on-sun operation at 100° C. with no failures. The maximum degradation observed in these subcells was a decrease in open-circuit voltage of about 1.2%.

For applications in space, radiation hardness, which refers to minimal degradation in device performance when exposed to ionizing radiation, including electrons and protons, is of great importance. Multijunction solar cells incorporating $Ga_{1-x}In_xN_yAs_{1-y-z}Sb_z$ subcells provided by the present disclosure have been subjected to proton radiation testing to examine the effects of degradation in space environments. Compared to Ge-based triple junction solar cells, the results demonstrate that these $Ga_{1-x}In_xN_yAs_{1-y-z}Sb_z$ containing devices have similar power degradation rates and superior voltage retention rates. Compared to non-lattice matched (metamorphic) triple junction solar cells, all metrics are superior for $Ga_{1-x}In_xN_yAs_{1-y-z}Sb_z$ containing devices. In certain embodiments, the solar cells include (Al)InGaP subcells to improve radiation hardness compared to (Al)(In)GaAs subcells.

Due to interactions between the different elements, as well as factors such as the strain in the layer, the relationship between composition and band gap for $Ga_{1-x}In_xN_yAs_{1-y-z}Sb_z$ is not a simple function of composition. The composition that yields a desired band gap with a specific lattice constant can be found by empirically varying the composition.

The thermal dose applied to the $Ga_{1-x}In_xN_yAs_{1-y-z}Sb_z$ material, which is controlled by the intensity of heat applied for a given duration of time (e.g., application of a temperature of 600° C. to 900° C. for a duration of between 10 seconds to 10 hours), that a $Ga_{1-x}In_xN_yAs_{1-y-z}Sb_z$ material receives during growth and after growth, also affects the relationship between band gap and composition. In general, the band gap increases as thermal dose increases.

As development progresses on $Ga_{1-x}In_xN_yAs_{1-y-z}Sb_z$ materials and solar cells comprising $Ga_{1-x}In_xN_yAs_{1-y-z}Sb_z$ subcells it is expected that material quality will continue to improve, enabling higher efficiencies from the same or similar compositions described in the present disclosure. It should be appreciated, however, that because of the complex interdependence of the GaInNAsSb material composition and the processing parameters it cannot necessarily be determined which combinations of materials and processing conditions will produce suitable high efficiency subcells having a particular band gap.

As the composition is varied within the $Ga_{1-x}In_xN_yAs_{1-y-z}Sb_z$ material system, the growth conditions need to be modified to achieve high performance. For example, for (Al)(In)GaAs, the growth temperature will increase as the fraction of Al increases and decrease as the fraction of In increases, in order to maintain the same material quality. Thus, as a composition of either the $Ga_{1-x}In_xN_yAs_{1-y-z}Sb_z$ material or the other subcells of the multijunction solar cell is changed, the growth temperature as well as other growth conditions must be adjusted accordingly.

Figure 2:
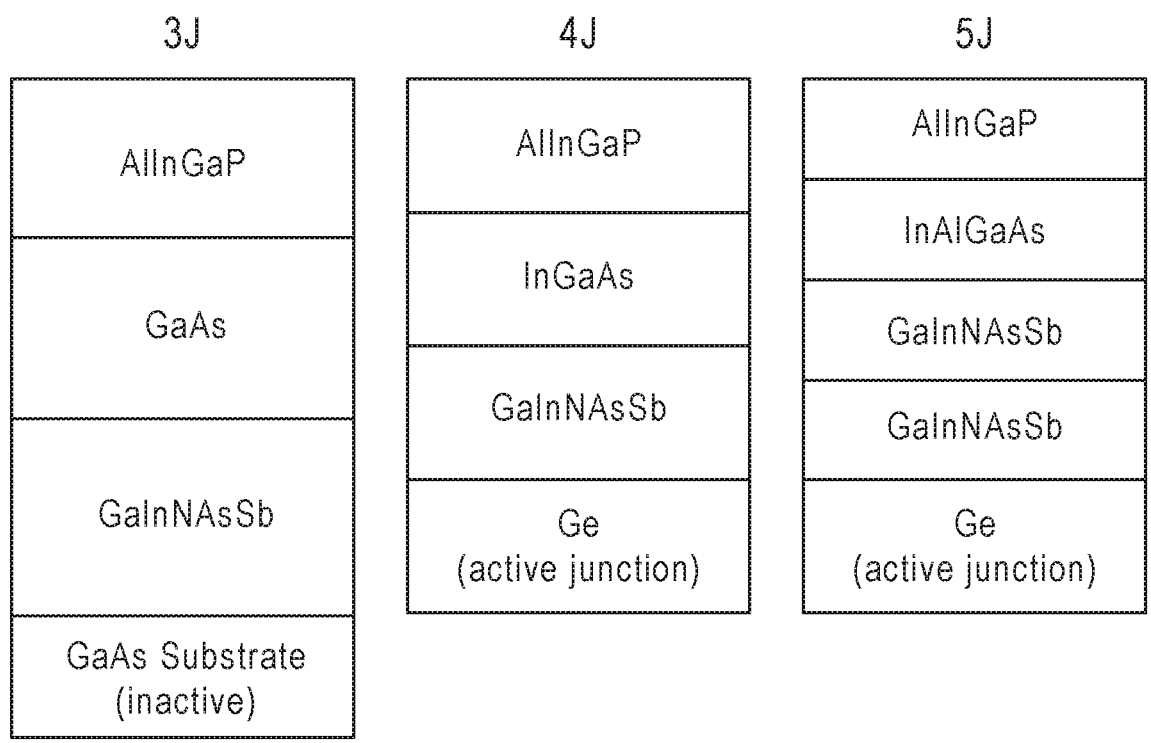
FIG. 2 shows examples of junction compositions in 3J, 4J and 5J (three-four- and five-junction) multijunction solar cells.

Schematic diagrams of three junction (3J), four junction (4J), and five junction (5J) solar cells are shown FIG. 2. In some examples as shown, the solar cells may be formed on a gallium arsenide (GaAs) substrate, or on a germanium (Ge) substrate. In certain embodiments, the substrate can comprise GaAs, InP, GaSb, (Sn,Si)Ge, or silicon. Except for the experimental examples, a germanium substrate includes a (Sn,Si)Ge substrate, such as Ge, SnGe, SiGe, and SnSiGe. A suitable substrate can have a lattice constant engineered to approximately match the lattice constant of Ge, such as a buffered silicon substrate. Examples of buffers that can be grown on silicon to allow growth of Ge include SiGeSn, and rare-earth oxides (REOs).

In operation, a multijunction solar cell is configured such that the subcell having the highest band gap faces the incident solar radiation, with subcells characterized by decreasingly lower band gaps situated underlying or beneath the uppermost subcell. The $Ga_{1-x}In_xN_yAs_{1-y-z}Sb_z$ subcell at the bottom of a 3J solar cell (FIG. 2) has a band gap within a range from 0.7 eV to 1.2 eV. The upper subcells can comprise (Al)(In)GaAs and (Al)(In)GaP, which have progressively higher band gaps to absorb high energy wavelengths of light. In a 4J or higher-junction solar cell, an active germanium subcell lies underneath the GaInNAsSb subcell to absorb lower energy of light. In some embodiments, such as a 5J or higher junction solar cell, two GaInNAsSb subcells with different band gaps may be used.

The specific band gaps of the subcells, are dictated, at least in part, by the band gap of the bottom subcell, the thicknesses of the subcell layers, and the spectrum of the incident light. Although there are numerous structures in the present disclosure that will produce efficiencies exceeding those of three junction solar cells, it is not the case that any set of subcell band gaps that falls within the disclosed ranges will produce an increased photovoltaic conversion efficiency. For a certain choice of bottom subcell band gap, or alternately the band gap of another subcell, the incident spectrum of light, the subcell materials, and the subcell layer thicknesses, there is a narrower range of band gaps for the remaining subcells that will produce efficiencies exceeding those of other three junction solar cells.

To create a complete multijunction solar cell, other layers that may be present include an anti-reflection coating, contact layers, tunnel junctions to couple the sub-cells in series, electrical contacts, and a substrate or wafer handle.

Although the various layers of a multijunction solar cell can be fabricated using semiconductor growth methods such as MOCVD an MBE, for certain materials higher quality layers are preferentially grown using a particular deposition method, such as by MOCVD or MBE. Thus, some layers of a multijunction solar cell are preferentially grown by MOVCD and other layers are preferentially grown by MBE. MOCVD and MBE are characterized by different growth environments.

Hybrid growth of devices formed using a combination of MOCVD and MBE to fabricate individual layers or groups of layers typically requires transfer of the semiconductor wafer and epitaxial layers from one growth environment to another. Consequently, a protective layer is often used to protect the first set of epitaxial layers during transfer from one growth environment to another growth environment. This is done to ensure that after the transfer the top surface of the first set of epitaxial layers is ready for epitaxial growth. Oxidation or contamination of the growth layer must be prevented to make hybrid growth viable. In addition to preventing oxidation or contamination of the underlying growth layer, it is also desirable that the protective layer reduce or prevent diffusion of hydrogen during MOCVD growth into underlying dilute nitride layers. It is also desirable that the protective layer withstand thermal treatments used in dilute nitride epitaxial processing. In embodiments of the present invention, a layer comprising Al is used as a protective layer overlying the at least one dilute nitride layer (or subcell).

Figure 13:
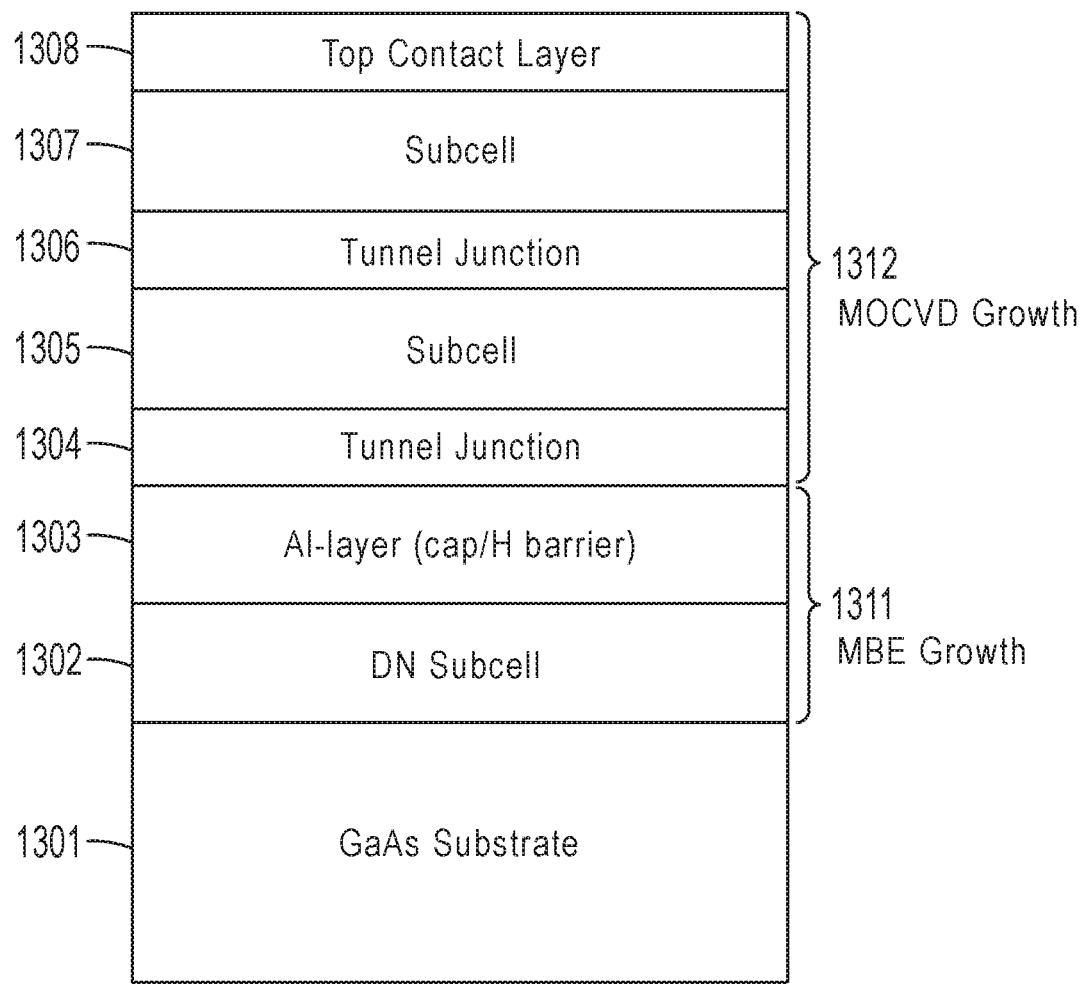
FIG. 13 shows a cross-section of an embodiment of a multijunction solar cell comprising a dilute nitride layer and an aluminum layer overlying the dilute nitride layer.
Figure 14:
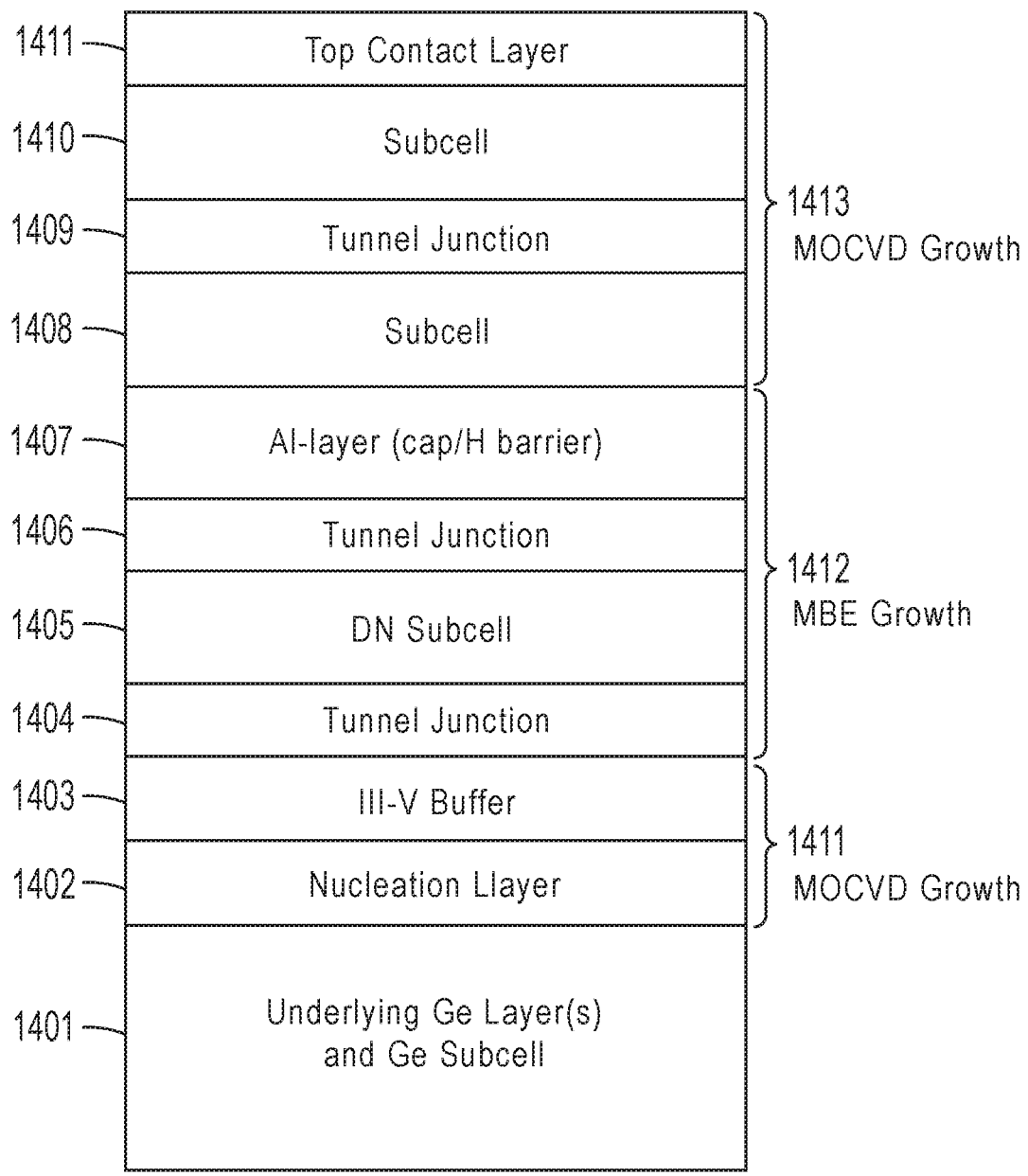
FIG. 14 shows a cross-section of another embodiment of a multijunction solar cell comprising a dilute nitride layer and an aluminum-containing layer overlying the dilute nitride layer.

FIGS. 13 and 14 show simplified cross-sections of a multijunction solar cell according to embodiments of the invention. FIG. 13 shows an example of a three junction cell designed for concentrated photovoltaic systems, formed on a GaAs substrate 1301. The dilute nitride subcell 1302 and at least a portion of the overlying layer comprising Al 1303 can be grown using an MBE process (1311). The remaining overlying layers (tunnel junction 1304, subcell 1305, tunnel junction 1306, subcell 1307 and top contact layer 1308) and a portion of the Al-containing layer 1303 (as required) can be grown using an MOCVD process (1312), allowing the MBE/MOCVD growth interface to be buried in the Al-containing layer 1303. In this example, the Al-containing layer 1303 underlies the tunnel junction 1304 that couples the dilute nitride subcell 1302 to the overlying subcell 1305. Al-containing layer 1303 is shown as a single layer for simplicity. However, it will be understood that Al-containing layer 1303 may comprise more than one Al-containing layer, with differing layer compositions and thicknesses, as described herein.

FIG. 14 shows an example of a four-junction cell formed on a Ge substrate 1401, which also serves as an active subcell. The Ge sub-cell 1401, nucleation layer 1402 and a portion of the buffer layer 1403 can be formed using an MOCVD process (1411). The tunnel junction 1404, coupling the Ge subcell 1401 to dilute nitride subcell 1405, the dilute nitride subcell 1405, the tunnel junction 1406 coupling the dilute nitride subcell 1405 to an overlying subcell 1408 and at least a portion of the overlying Al-containing layer 1407 can be grown using an MBE process (1412). The remaining overlying layers (subcell 1408, tunnel junction 1409, subcell 1410 and top contact layer 1411) and a portion of the Al-containing layer 1407 (as required) can be grown using an MOCVD process (1413), allowing the MBE/MOCVD growth interface to be buried in the Al-containing layer 1407. In this example, the Al-containing layer 1407 overlies the tunnel junction 1406 that couples the dilute nitride subcell 1405 to the overlying subcell 1408. Al-containing layer 1407 is shown as a single layer for simplicity. However, it will be understood that Al-containing layer 1407 may comprise more than one Al-containing layer, with differing layer compositions and thicknesses, as described herein.

FIG. 3A-3D show examples of a 4J solar cell structures with the additional elements. The additional elements that may be present in a complete solar cell, include buffer layers, tunnel junctions, back surface field, window, emitter, nucleation layers, and front surface field layers. In the examples shown in FIGS. 2-3 and in FIGS. 13-14 all subcells are substantially lattice-matched to each other and may be interconnected by tunnel junctions. Multijunction solar cells may also be formed without one or more of the elements listed above, as known to those skilled in the art.

In each of the embodiments described herein, the tunnel junctions are designed to have minimal light absorption. Light absorbed by tunnel junctions is not converted into electricity by the solar cell, and thus if the tunnel junctions absorb significant amounts of light, it will not be possible for the efficiencies of the multijunction solar cells to exceed those of the best multijunction junction solar cells. Accordingly, the tunnel junctions must be very thin (for example, less than 40 nm) and/or be made of materials with band gaps equal to or greater than the subcells immediately above the respective tunnel junction. An example of a tunnel junction fitting these criteria is a GaAs/AlGaAs tunnel junction, in which each of the GaAs and AlGaAs layers forming the tunnel junction has a thickness between 5 nm and 40 nm. The GaAs layer can be doped with Te, Se, S and/or Si, and the AlGaAs layer can be doped with C. InGaAs may also be used in the tunnel junctions instead of GaAs and/or AlGaAs.

Another example of a suitable tunnel junction is a GaInP/AlGaAs tunnel junction, with similar thicknesses, and where the InGaP layer can be doped with Te, Se, S and/or Si, and the AlGaAs layer can be doped with C.

Various metrics can be used to characterize the quality of an optoelectronic device, including, for example, the Eg/q-Voc, the efficiency over a range of irradiance energies, the open circuit voltage, Voc, and the short circuit current density, Jsc. Those skilled in the art can understand how to extrapolate the Voc and Jsc measured for a junction having a particular dilute nitride base thickness to other junction thicknesses. The Jsc and the Voc are the maximum current density and voltage, respectively, for a solar cell. However, at both of these operating points, the power from the solar cell is zero. The fill factor (FF) is a parameter which, in conjunction with Jsc and Voc, determines the maximum power from a solar cell. The FF is defined as the ratio of the maximum power produced by the solar cell to the product of Voc and Jsc. Graphically, the FF is a measure of the "squareness" of the solar cell and is also the area of the largest rectangle, which will fit within the IV (current-voltage) curve.

Seemingly small improvements in the efficiency of a junction/subcell can result in significant improvements in the efficiency of a multijunction solar cell. Again, seemingly small improvements in the overall efficiency of a multijunction solar cell can result in dramatic improvements in output power, reduce the area of a solar array, and reduce costs associated with installation, system integration, and deployment.

Solar cell efficiency is important as it directly affects the solar module power output. For example, assuming a 1 $m^2$ solar panel having an overall 24% conversion efficiency, if the efficiency of multijunction solar cells used in a module is increased by 1% such as from 40% to 41% under 500 suns, the module output power will increase by about 2.7 kW.

Generally, a solar cell contributes around 20% to the total cost of a solar power module. Higher solar cell efficiency means more cost-effective modules. Fewer solar devices are then needed to generate the same amount of output power, and higher output power with fewer devices leads to reduced system costs, such as costs for mounting racks, hardware, wiring for electrical connections, etc. In addition, by using high efficiency solar cells to generate the same power, less land area, fewer support structures, and lower labor costs are required for installation.

Solar modules are a significant component in spacecraft power systems. Lighter weight and smaller solar modules are always preferred because the lifting cost to launch satellites into orbit is super expensive. Solar cell efficiency is especially important for space power applications to reduce the mass and fuel penalty due to large arrays. The higher specific power (watts generated over solar array mass), which determines how much power one array will generate for a given launch mass, can be achieved with more efficient solar cells because the size and weight of the solar array will be less for the same power output.

As an example, compared to a nominal solar cell having a 30% conversion efficiency, a 1.5% increase in multijunction solar cell efficiency can result in a 4.5% increase in output power, and a 3.5% increase in multijunction solar cell efficiency can result in an 11.5% increase in output power. For a satellite having a 60 kW power requirement, the use of higher efficiency subcells can result in solar cell module cost savings from $0.5 million to $1.5 million, and a reduction in solar array surface area of 6.4 $m^2$ to 15.6 $m^2$, for multijunction solar cells having increased efficiencies of 1.5% and 3.5%, respectively. The overall cost savings will be even greater when costs associated with system integration and launch are taken into consideration.

One important problem to solve in making hybrid epitaxy viable is the potential oxidation or contamination of exposed interface layers as epitaxial growth is interrupted and epi-wafers are moved from one reactor to another. Any imperfections at the interface where growth resumes will result in poor overgrown epitaxial material. In production, cluster tools and controlled-atmosphere boxes are employed. A possible solution is the careful design of the epitaxial stack so that interruption of epitaxy occurs at layers that form a protective cap from oxidation. Consider this in the context of the 4-junction (4J) lattice-matched solar cell (FIGS. 2, 3A and 14), where the epitaxial material is grown on a p-doped germanium substrate that is oriented in an-off axis crystallographic direction. The bottom junction (or J4 subcell) is created in the germanium substrate using a MOCVD growth technique. The top layer of this J4 structure is a 30 nm- to 150 nm-thick layer of n-doped (In)GaAs (buffer layer), which protects this epiwafer from oxidation as it is removed from the MOCVD reactor and inserted into an MBE chamber for growing the dilute nitride junction (J3). Epitaxial growth resumes in the MBE by completing the n-doped (In)GaAs buffer layer, then growing a tunnel junction, back surface field and a layer of dilute nitride for J3.

A layer of (In)GaAs and/or (Al)GaAs can be grown over the dilute nitride layer as a protective cap layer before the epiwafer is removed from the MBE and loaded into an MOCVD to finish the growth of junctions J2 and J1. (In)GaAs and (Al)GaAs are materials that can also function as a tunnel junction, a back surface field (BSF), a front surface field (FSF), a window layer and an emitter layer. Consider this in the context of the 4J lattice-matched solar cell shown in FIG. 3A—after growth of the GaInNAsSb base by MBE, an InGaAs emitter and an InGaAs tunnel junction can be grown over the GaInNAsSb base. After that, an AlGaAs BSF can be grown over the InGaAs layers. Because either the InGaAs or AlGaAs layer can be used as a protective layer over the GaInNAsSb before the epiwafer is transferred from the MBE to the MOCVD, epitaxial growth can be interrupted after growth of either of these layers. Once the epiwafer is in the MOCVD, growth of subsequent layers may continue.

The aluminum-containing protective layer can also mitigate the effects of hydrogen diffusion into the underlying dilute nitride material during growth of the overlying layers in a MOCVD environment Hydrogen is known to act as an isolated donor in dilute nitrides, can intentionally passivate dopants by forming complexes with the intentional dopants, and is also known to form complex defects of nitrogen and hydrogen, such as N—H, and N—H-VGa. The presence of hydrogen in dilute nitrides can therefore affect the electrical properties of dilute nitrides. The use of an aluminum-containing protective layer can provide a hydrogen diffusion barrier, preventing the creation of doping passivation-compensation, isolated donors, and/or other defects in the dilute nitride material.

The aluminum-containing layer can be formed immediately above the tunnel junction (FIG. 3A, FIG. 3B, and FIG. 14) or immediately below a tunnel junction (FIG. 3C, FIG. 3D, and FIG. 13).

An aluminum-containing layer can be a single layer or can be more than one aluminum-containing layer where each aluminum-containing layer can have the same alloy composition or can have different alloy compositions, which may be deposited under the same or different growth conditions. The aluminum-containing layer can be adjacent the dilute nitride layer.

The dilute nitride layer or layers and the one or more aluminum-containing layers can be grown by MBE and the overlying semiconductor layer can be grown by MOCVD. The overlying semiconductor layer can comprise GaAs, InGaAs, or InGaP.

In addition to an aluminum-containing layer adjacent to and overlying a dilute nitride layer, a device can include one or more additional aluminum-containing layers such as an aluminum-containing cap layer, an aluminum-containing back surface field, an aluminum-containing reflector layer, an aluminum-containing window layer, and a combination of any of the foregoing. An aluminum-containing cap layer can immediately overly the aluminum-containing layer and can comprise, for example, AlGaAs or InAlP. An aluminum-containing cap layer can have a thickness, for example, from 100 nm to 5 μm, from 100 nm, to 4 μm, from 100 nm to 2 μm, from 100 nm to 1 μm, or from 100 nm to 500 nm. An aluminum-containing back surface field can comprise, for example, AlInGaP and can have a thickness from 50 nm to 300 nm. An aluminum-containing reflector layer can comprise at least two different materials with different refractive indices and at least two different layer thicknesses, with at least one material comprising Al. The aluminum-containing reflector can comprise, for example semiconductor materials of Groups III and V of the periodic table such as, for example, AlAs, AlGaAs, GaAs, InAs, InGaAs, AlInAs, InGaP, AlInGaP, InGaP, GaP, InP, AlP, AlInP, or AlInGaAs. An aluminum-containing window layer can have a thickness, for example, from 100 nm and 5 microns.

An aluminum-free layer can overly and be adjacent to an aluminum-containing layer. The aluminum-free layer can have a thickness, for example, from 1 nm to 200 nm, from 1 nm to 100 nm, from 5 nm to 75 nm, from 10 nm to 50 nm, or from 10 nm to 30 nm. An aluminum-free layer can comprise, for example, GaAs or InGaP. The aluminum-free layer can be a functional layer such as, for example, a window layer or a mirror of a solar cell.

Referring to FIG. 3A in more detail, a p-doped germanium substrate 302 is provided and cleaned to remove native oxides prior to atomic-layer deposition. The substrate may be cleaned, for example, in a gaseous environment such as an $AsH_3$ environment or a $PH_3$ environment. This cleaning step also allows the group V atoms to diffuse into the upper region of germanium. An emitter region is formed as the upper germanium region and is doped with a group V element comprising arsenic or phosphorus, transforming the germanium substrate into an active n-p junction, with a p-doped region and an n-doped region overlying the p-doped region. In the four-cell embodiment shown in FIG. 3A, this cell is referred to as "J4". The extent of group-V diffusion can be influenced by thermal exposure during substrate cleaning, epitaxial growth, and post-growth annealing treatments. In some embodiments, a phosphide layer or an arsenide layer can be deposited on the top surface of substrate 302, with the deposition conditions allowing for diffusion of the group V atoms into substrate 302 to form the n-doped region. A nucleation layer 304 can be epitaxially grown over the p-doped germanium junction 302. A nucleation layer 304 is epitaxially grown on the top surface of the germanium junction 302. The nucleation layer can be, for example, InGaP. However, other nucleation layers are known and are disclosed in U.S. Pat. No. 6,380,601 B1 and in U.S. Pat. No. 7,339,109 B2, although the nucleation layers disclosed in these publications were not applied to dilute-nitride-based multijunction cells. Nucleation layers used with dilute nitride materials are described in U.S. Application Publication No. 2018/0053874 and in U.S. Provisional Application No. 62/630,937 filed on Feb. 15, 2018, each of which is incorporated by reference in its entirety. Nucleation layers can comprise, for example, InGaP, InGaPSb, InAlP, AlP, AlPSb, GaPSb, AlGaPSb, InAlPSb, InAlPBi, InAlPSbBi, AlInGaP, AlInGaPSb, AlInGaPBi, AlInGaPSbBi, AlP, AlPSb, AlPBi, AlPSbBi, AlAsSb, AlAsBi, AlAsSbBi, AlN, AlNSb, AlNBi, or AlNSbBi. Nucleation layer 304 can have a thickness, for example less than 200 nm, less than 100 nm, less than 50 nm, less than 20 nm, less than 10 nm, or less than 1 nm. Nucleation layer 304 can be, for example, from 2 nm to 20 nm thick, from 2 nm to 10 nm, from 2 nm to 5 nm, or from 4 nm to 10 nm. A nucleation layer 304 can be n-doped. A buffer layer 306 can then be epitaxially grown over nucleation layer 304. A buffer layer can comprise (In)GaAs. A (In)GaAs buffer layer can be, for example, from 100 nm to 900 nm thick, from 200 nm to 800 nm thick, from 300 nm to 700 nm thick, or from 400 nm to 600 nm thick. A buffer 306 can be n-doped. A nucleation layer and at least a portion of the buffer layer can be grown using MOCVD.

In some embodiments, after growth of at least a portion of the buffer layer 306, the sample can be transferred to an MBE chamber for subsequent growth of the dilute nitride sub-cell or junction. In some embodiments, buffer layer 306 may be completed by growing several nanometers (e.g., 2 nm to 100 nm) of (In) GaAs using MBE, prior to deposition of the subsequent layers to ensure that a growth interrupt occurs in the buffer layer and is not directly adjacent to a structure such as the overlying tunnel junction. After completion of the buffer layer, a tunnel junction 308 can then be epitaxially grown over buffer layer 306. Tunnel junction 308 can comprise two InGaAs layers, with the first layer 308A having a high n-type doping level, and the second layer 308B having a high p-type doping level. Compositions, thicknesses and doping levels required to form tunnel junctions are known in the art. For example, n-dopants can include Si, Se, and Te and n-type doping levels can range from $1 \times 10^{19}$ cm$^{-3}$ to $2 \times 10^{20}$ cm$^{-3}$. P-type dopants can include C and doping levels greater than about $1 \times 10^{19}$ cm$^{-3}$ and up to $2 \times 10^{20}$ cm$^{-3}$ can be used. Thicknesses for the doped layers in tunnel junctions can be between about 5 nm and 40 nm.

Sub-cell 301 (referred to as "J3") is then epitaxially deposited on tunnel junction 308. Sub-cell 301 comprises a p-doped InGaAs back surface field layer 310, a p-doped GaInNAsSb base layer 312A, an intrinsic or unintentionally doped base layer 312B and an n-doped InGaAs emitter layer 314. The p-doped layer 312A and layer 312B can comprise, individually, $Ga_{1-x}In_xN_yAs_{1-y-z}Sb_z$, with $0 \leq x \leq 0.24$, $0.001 \leq y \leq 0.07$ and $0.001 \leq z \leq 0.2$, or with $0.08 \leq x \leq 0.24$, $0.02 \leq y \leq 0.05$ and $0.001 \leq z \leq 0.02$, or with $0.07 \leq x \leq 0.18$, $0.025 \leq y \leq 0.04$ and $0.001 \leq z \leq 0.03$, or with $0 \leq x \leq 0.4$, $0 < y \leq 0.07$, and $0 < z \leq 0.04$. The p-doped base layer 312A can have a graded doping profile, with the doping level decreasing from the interface with back surface field 310 to the interface with base layer 312B. The doping in base layer 312B can be graded exponentially between $1 \times 10^{19}$ cm$^{-3}$ and $1 \times 10^{15}$ cm$^{-3}$, for example between $1 \times 10^{18}$ and $5 \times 10^{15}$ cm$^{-3}$, or between $2 \times 10^{17}$ and $7 \times 10^{15}$ cm$^{-3}$, where the minimum doping level is greater than or equal to the background doping level of the layer. Base layer 312B can be an intrinsic layer or an unintentionally doped layer, with a background doping concentration less than about $1 \times 10^{16}$ cm$^{-3}$ or less than about $5 \times 10^{15}$ cm$^{-3}$ or less than about $1 \times 10^{15}$ cm$^{-3}$. Base layer 312B can also be doped at a fixed doping level of $1 \times 10^{16}$ cm$^{-3}$ or less. Sub-cell 301 can have a thickness between about 1 micron and 4 microns.

A tunnel junction 316 can then be epitaxially grown over sub-cell 301. Tunnel junction 316 comprises two InGaAs layers, one with high p-type doping, the other with high n-type doping. Compositions, thicknesses and doping levels used to form tunnel junctions are known in the art. For example, typical n-dopants include Si, Se, and Te and n-type doping levels can range between $1 \times 10^{19}$ cm$^{-3}$ and up to $2 \times 10^{20}$ cm$^{-3}$. P-type dopants include C and doping levels greater than $1 \times 10^{19}$ cm$^{-3}$ and up to $2 \times 10^{20}$ cm$^{-3}$ can be used. Thicknesses for the doped layers in tunnel junctions can be between about 5 nm and 40 nm.

Sub-cell 303 (referred to as "J2") is then epitaxially formed on tunnel junction 316. Sub-cell 303 comprises an Al-containing back surface field layer 318. Back surface field layer 318 also serves as a hydrogen barrier layer. FIG. 3A shows layer 318 as a single layer. However, it will be understood that back surface field layer 318 may include more than one material layer. To function as a hydrogen barrier, layer 318 comprises Al. For example, layer 318 can comprise AlGaAs, or InAlP and can be lattice matched or pseudomorphically strained to the substrate. The thickness of layer 318 can be, for example, between 100 nm and 5 microns. In some embodiments, layer 318 can comprise an Al-containing layer capped by a layer of GaAs, InGaAs or InGaP, having a thickness, for example, between 1 nm and 50 nm, or between 2 nm and 10 nm, or between 2 nm and 5 nm.

After growth of layer 318 (or at least a portion of layer 318, the wafer is transferred to an MOCVD chamber for deposition of the remainder of layer 318 (if desired) and the remaining layers to complete the multijunction cell. Sub-cell 303 is completed by deposition of base 320, emitter 322 and front surface field layer 324. A tunnel junction 326 is then epitaxially grown. Compositions, thicknesses and doping levels used to form tunnel junctions are known in the art. By way of example, tunnel junction 326 is shown comprising a GaAs layer and an AlGaAs layer. However, it will be understood that other materials may be used. For example, the tunnel junction may comprise an InGaP layer and/or an AlGaAs layer. Examples of n-dopants for the tunnel junction layers include Si, Se, and Te and n-type doping levels in a range between $1 \times 10^{19}$ cm$^{-3}$ and up to $2 \times 10^{20}$ cm$^{-3}$ can be used. P-type dopants can include C and doping levels in a range between $1 \times 10^{19}$ cm$^{-3}$ and up to $2 \times 10^{20}$ cm$^{-3}$ can be used. Thicknesses for the doped layers in tunnel junctions can be between 5 nm and 40 nm. Sub-cell 305 (J1) is then epitaxially grown, depositing in sequence back surface field layer 328, base layer 330, emitter layer 332, front surface field layer 334, and contact layer 336.

FIG. 3B shows an alternative implementation of a hydrogen diffusion barrier. After completion of growth of tunnel junction 316, a reflector 307 is deposited. Reflector 307 is shown as a single layer. However, it will be understood that reflector layer can include one or more layers with differing compositions, thicknesses and doping levels in order to provide the appropriate optical and/or electrical functionality, and to improve interface quality, electron transport, hole transport and/or other optoelectronic properties. Reflector 307 can comprise alternating layers of materials having different refractive indices. The refractive index difference between the layers, and the layer thicknesses provides a reflectivity over a desired wavelength range. Reflector 307 comprises at least two different materials with different refractive indices and at least two different layer thicknesses, with at least one material comprising Al. Reflector 307 can comprise, for example semiconductor materials of Groups III and V of the periodic table such as, for example, AlAs, AlGaAs, GaAs, InAs, InGaAs, AlInAs, InGaP, AlInGaP, InGaP, GaP, InP, AlP, AlInP, or AlInGaAs. An example of a reflector is a distributed Bragg reflector (DBR). A DBR may comprise a plurality of alternating AlGaAs/GaAs layers, with thicknesses selected to provide a desired reflectivity over a given wavelength range. Other reflector designs may also be used. Reflector 307 can be designed to reflect wavelengths absorbed by the overlying sub-cell 303. Reflector 307 can also serve as a hydrogen diffusion barrier. At least a portion of reflector 307 can be grown by MBE, after which the epiwafer is transferred to an MOCVD chamber. In some embodiments, reflector 307 may be completed by MOCVD growth, after which overlying back surface field 318 and the remaining layers can be grown via MOCVD.

The hydrogen barrier layer may also underlie the InGaAs tunnel junction 316, as shown in FIG. 3C. In this embodiment, a window layer 309 grown by MBE overlies emitter 314 and underlies tunnel junction 316. Window layer 309 is shown as a single layer. However, it will be understood that window layer 309 may include more than one material layer. To function as a hydrogen diffusion barrier, window layer comprises Al, for example, AlGaAs or AlInP, and may be between 100 nm and 5 microns thick, such as from 100 nm to 4 µm, from 100 nm to 2 µm, from 100 nm to 1 µm, or from 100 nm to 500 nm. In some embodiments, window layer 309 can comprise an Al-containing layer capped by a layer of GaAs, InGaAs, or InGaP having a thickness between 1 nm and 50 nm, between 2 nm and 10 nm, or between 2 nm and 5 nm. After MBE growth of window layer 309, or at least a portion of window layer 309, MOCVD growth can be used to complete the window layer (if desired) and for the remaining layers of the device.

FIG. 3D shows yet another embodiment of a hydrogen diffusion barrier underlying tunnel junction 316. In this example, emitter layer 314 shown in FIG. 3A is replaced by emitter layer 315 comprising Al. Emitter layer 315 is shown as a single layer. However, it will be understood that emitter layer 315 may include more than one material layer. To function as a hydrogen diffusion barrier, emitter layer comprises Al, for example, AlGaAs or AlInP, and may be between 100 nm and 5 microns thick. In some embodiments, emitter layer 315 can comprise an Al-containing layer capped by a layer of GaAs, InGaAs, or InGaP having a thickness between 1 nm and 50 nm, between 2 nm and 10 nm, or between 2 nm and 5 nm. MBE can be used to grow at least a portion of layer 315. MOCVD growth can be used to complete growth of layer 315 (if desired) and for the remaining layers of the device.

The dilute nitride material is a high-efficiency solar material only if it is processed in particular ways. For example, thermal treatment is needed to activate the material. It is not trivial to determine the specific process step(s) during which thermal treatment must be applied for annealing.

In general, a thermal treatment, such as a rapid thermal treatment (RTA) refers to exposure to a temperature that can range from 600° C. to 900° C. for a duration from 5 seconds to 3 hours. In some cases, there are no limits for temperature and time. Table 1 summarizes typical thermal treatment parameters by deposition method or thermal annealing condition.

TABLE 1

Thermal treatment methods, temperatures and exposure times.

| Method | MBE | MOCVD | RTA | Oven or furnace |
|---|---|---|---|---|
| Time | 2-3 hours | 0.5-1 hour | 0.1-10 minutes | Any duration |
| Temperature | 600° C.-650° C. | 630° C.-700° C. | 600° C.-900° C. | Any temperature |

Figure 1B:
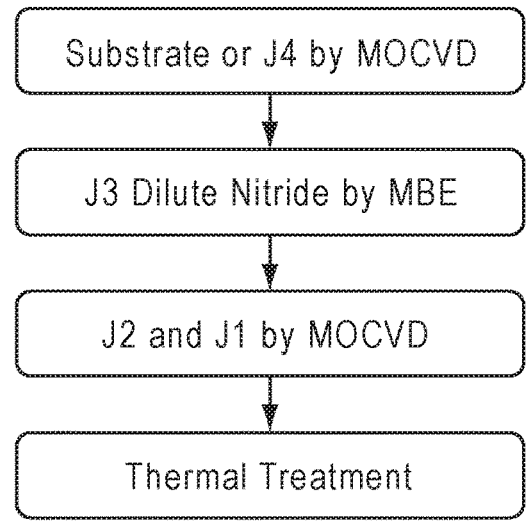
Figure 1C:
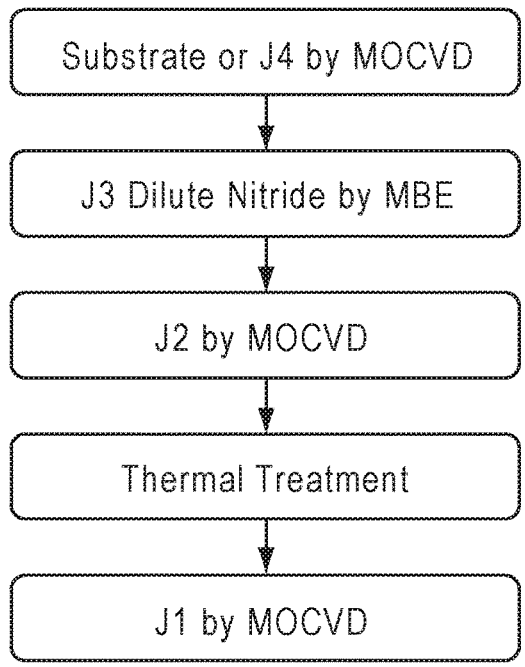
Figure 1D:
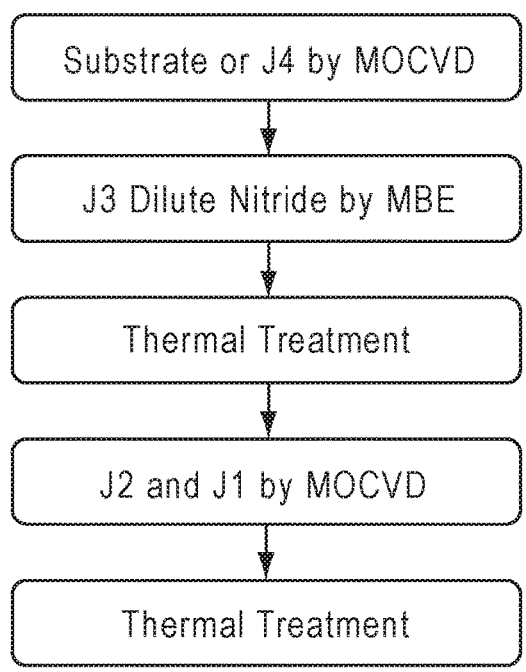

Thermal treatment can damage the surface morphology of a dilute nitride J3 subcell, which has to be of sufficient quality for additional epitaxial growth in the MOCVD reactor. Although it is possible to thermally treat a dilute nitride J3 subcell prior to subsequent epitaxial growth (FIG. 1A) or after all epitaxial growth is completed (FIG. 1B), it is unclear which practice is best to produce a high efficiency device. An increase in haze post-thermal treatment is not uncommon and is indicative of structural defects. Thermal treatment prior to MOCVD growth will create areas with haze in the dilute nitride J3 subcell, which can nucleate structural defects in subsequent epitaxial layers grown on the dilute nitride J3 subcell. These defects can propagate throughout the device structure and thereby decrease device performance. In addition, exposure of the growing epi-wafer in the MOCVD reactor can provide sufficient thermal load to activate the dilute nitride J3 subcell, which would render additional thermal treatment redundant.

An additional consideration for multijunction solar cells grown on an active germanium substrate (FIG. 2) is to design the structure of upper junctions and the growth conditions such that the thermal load is maintained below a threshold that otherwise causes the bottom dilute nitride subcell to degrade due to excess diffusion of phosphorus into the active germanium substrate. This degradation reduces open circuit voltage (Voc) and the conversion efficiency of the bottom germanium junction. Limiting the thermal load during growth of the upper junctions can be accomplished by a combination of one or more of the following measures: (i) reducing the growth temperature, (ii) reducing the growth time by increasing growth rates; and (iii) reducing the growth time by reducing the thickness of some of the layers in the upper junctions.

Figure 1E:
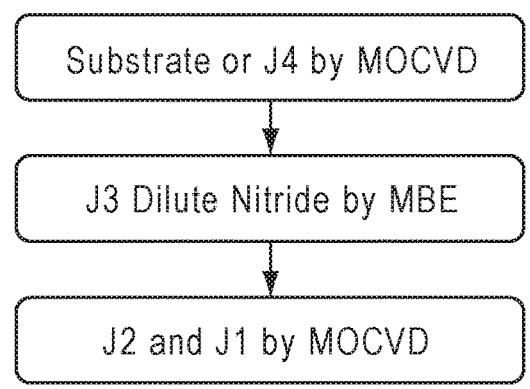

Another consideration in multijunction solar cells grown on a germanium or GaAs substrate (FIG. 2) is to design the epitaxial structure and the epitaxial growth conditions of the J2 and J1 junctions above the dilute nitride junction (which is J3 in the 4J solar cell on germanium embodiment, and J3 on the 3J solar cell on GaAs embodiment) to apply enough thermal load during the MOCVD growth of J2 and J1 to fully anneal the dilute nitride junction. In this case, the dilute nitride junction is fully annealed in situ during the MOCVD growth of the upper junction and no additional ex-site thermal treatment is required (FIG. 1E). Delivering the appropriate thermal load to adequately anneal the dilute nitride junction during the MOCVD growth of the upper junctions can be accomplished by a combination of one or more of the following measures: (i) reducing the growth temperature during the MOCVD growth of upper junction, (ii) reducing the MOCVD growth time by increasing growth rates; and (iii) reducing the MOCVD growth time by reducing the thickness of some of the layers in the upper junctions. Over-annealing the dilute nitride by excessive thermal load during J2 and J1 growth will not only degrade the dilute nitride junction but will also degrade the bottom junction in the case of a 4J solar cell on germanium.

As an alternative, one can also apply sufficient thermal load during the MOCVD growth of the J2 and J1 subcells to partially anneal or under-anneal the dilute nitride J3 subcells. Delivering the appropriate thermal load to partially anneal or under-anneal the dilute nitride junction in-situ during the MOCVD growth of the upper junctions can be accomplished by a combination of one or more of the aforementioned measures that pertain to growth temperatures, rates and times. An additional thermal anneal can be performed ex situ after all epitaxial growth is completed, using one of several possible methods including, for example, RTA (rapid thermal anneal), oven baking, or tube furnace annealing.

Test structures were grown as described in Table 2 and FIG. 4 and were tested with various process and thermal treatment parameters to determine best practices.

TABLE 2

Test structures and thermal treatment before/after MOCVD growth.

| Test structure | MBE Growth | RTA before MOCVD | MOCVD Growth | RTA after MOCVD |
|---|---|---|---|---|
| 4-1 | Dilute nitride/Ge | Yes | (In)GaAs | No |
| 4-2 | Dilute nitride/Ge | No | (In)GaAs | Yes |
| 4-3 | Dilute nitride/Ge | No | (In)GaAs | No |
| 4-4 | Dilute nitride/Ge | Yes | None | No |

Figure 5:
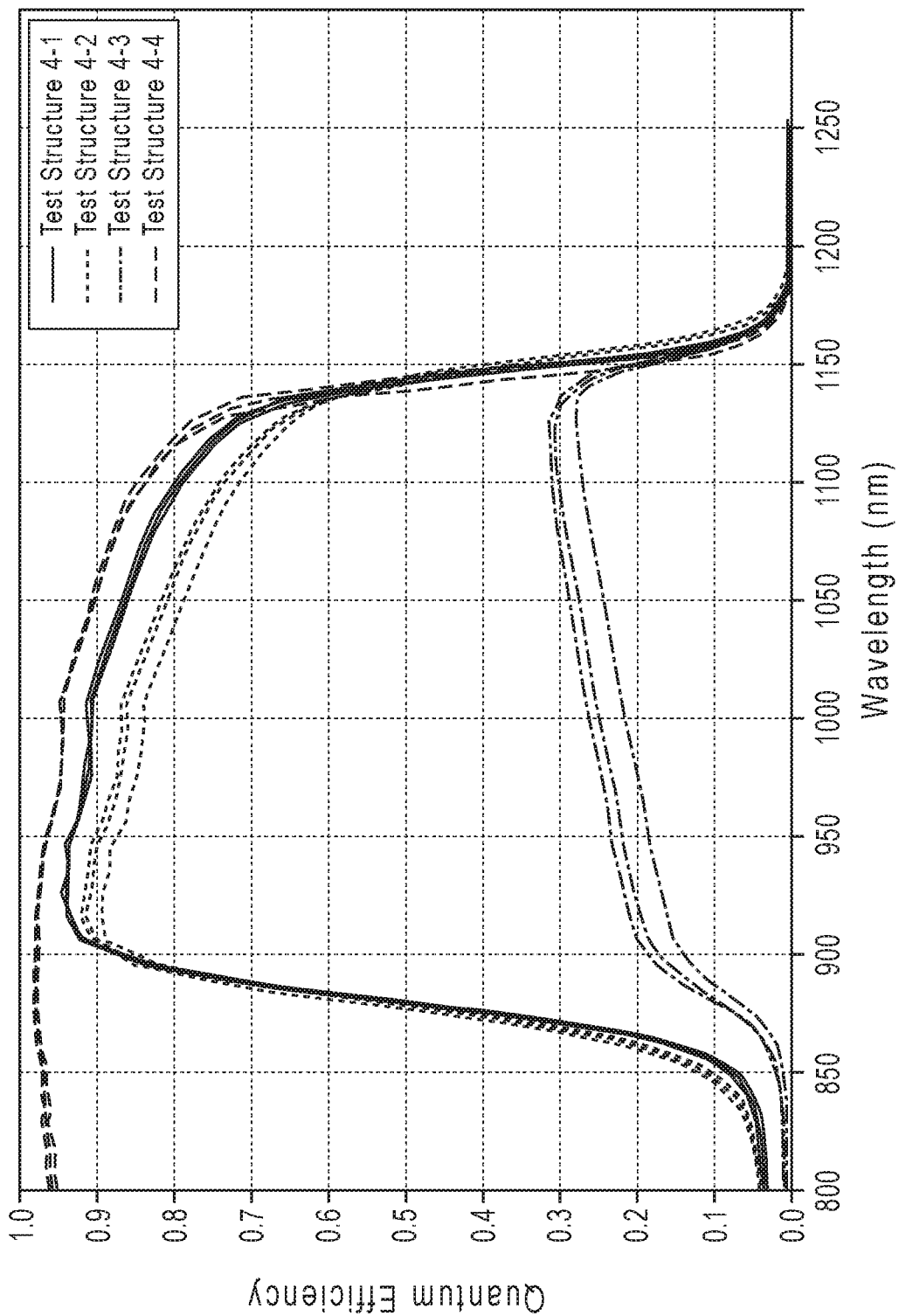
FIG. 5 shows the quantum efficiency of the test structures described in FIG. 4.

FIG. 4 shows schematics of test structures that were used for thermal treatment assessment. Experimental details are also shown in Table 2. Test structures 4-1, 4-2, 4-3 and 4-4 each had a dilute nitride junction layer over a germanium junction. Test structures 4-1, 4-2 and 4-3 each had a top (In)GaAs layer grown by MOCVD while test structure 4-4 did not. Although test structures 4-1 and 4-4 were both exposed to thermal treatment by RTA after MBE growth of the dilute nitride, only 4-1 was transferred into the MOCVD for (In)GaAs growth. As shown in FIG. 5, the quantum efficiency (QE) of the dilute nitride junction for these two structures showed that exposure to the MOCVD reactor degraded the performance of the dilute nitride junction.

Test structure 4-1 was exposed to thermal treatment by RTA after MBE growth of the dilute nitride junction, whereas test structure 4-2 was exposed to thermal treatment, also by RTA, after MOCVD growth. As shown in FIG. 5, the QE of the dilute nitride subcell for these two structures showed that thermal treatment applied after MBE growth (before MOCVD growth) resulted in better performance.

Test structure 4-3 was not exposed to thermal treatment and the dilute nitride junction exhibited significantly lower QE when compared to the QE of the other test structures shown in FIG. 5.

Secondary ion mass spectrometry (SIMS) analysis of test structures showed that high levels of hydrogen was present in structures that were processed in the MOCVD reactor. Structures that were produced only by MBE had relatively low levels of hydrogen. Practitioners in the art have noted that the hydrogen level in an ammonia MBE is several orders of magnitude lower than that found in an MOCVD growth processes. During MOCVD growth, hydrogen gas arises from two sources: (1) the hydrogen gas carrier; and (2) the cracking of arsine or phosphine at the semiconductor surface, during which covalent bonds are broken and hydrogen is released. Hydrogen can diffuse into the dilute nitride junction and create doping passivation-compensation or defects in the dilute nitride material.

To test this hypothesis, test structures 6-1, 6-2 and 6-3 were exposed to different MOCVD environments and are described in Table 3 and FIG. 6.

TABLE 3

Test structures and MOCVD environment.

| Test structure | MBE Growth | RTA before MOCVD | MOCVD environment |
|---|---|---|---|
| 6-1 | Dilute nitride/Ge | Yes | N/A |
| 6-2 | Dilute nitride/Ge | Yes | Nitrogen |
| 6-3 | Dilute nitride/Ge | Yes | Arsine |

Figure 7:
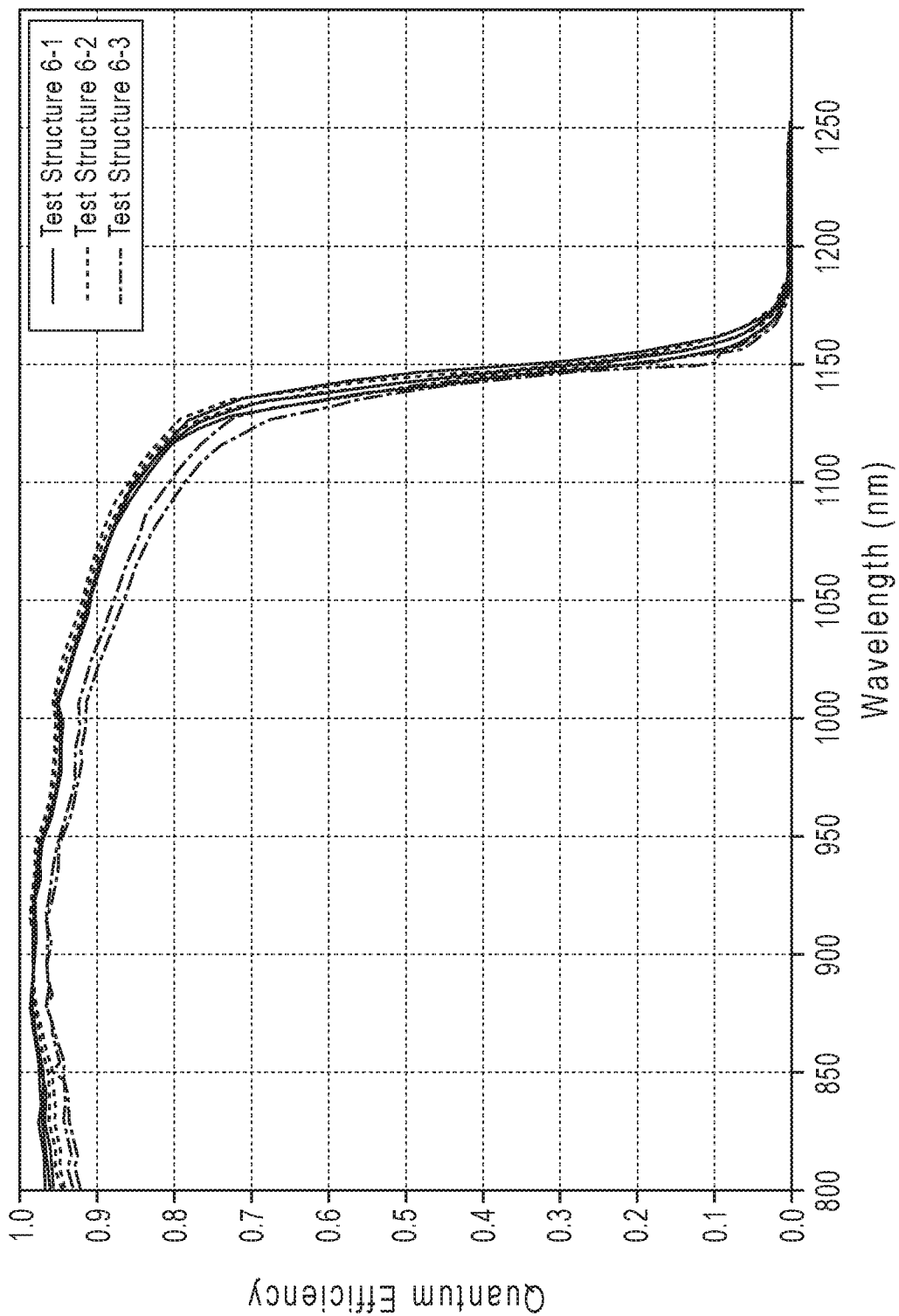
FIG. 7 shows the quantum efficiency of the test structures described in FIG. 6.

Test structure 6-3 was exposed to arsine in the MOCVD and exhibited a lower QE than test structures 6-1 and 6-2, which were either not exposed to the MOCVD or were exposed to a nitrogen-only MOCVD environment, respectively (FIGS. 6 and 7).

Another solution to hydrogen contamination is to protect the dilute nitride with a barrier. Hydrogen getters are materials capable of binding hydrogen gas under low pressure (less than 1 atm) and can be incorporated in the design of a multijunction solar cell. Although it is common practice to liberate absorbed hydrogen by applying thermal treatment post-epitaxial growth (FIGS. 1B-1D, and 10), doing so can further worsen the doping profiles already altered by hydrogen diffusion, resulting in even poorer device performance. In any embodiment of a multijunction solar cell that has a layer of dilute nitride, a hydrogen getter material caps the dilute nitride before the epiwafer is removed from the low-hydrogen environment of the MBE. Once in the MOCVD, the hydrogen getter preserves the quality of the underlying dilute nitride by absorbing hydrogen gas on its surface.

Figure 9:
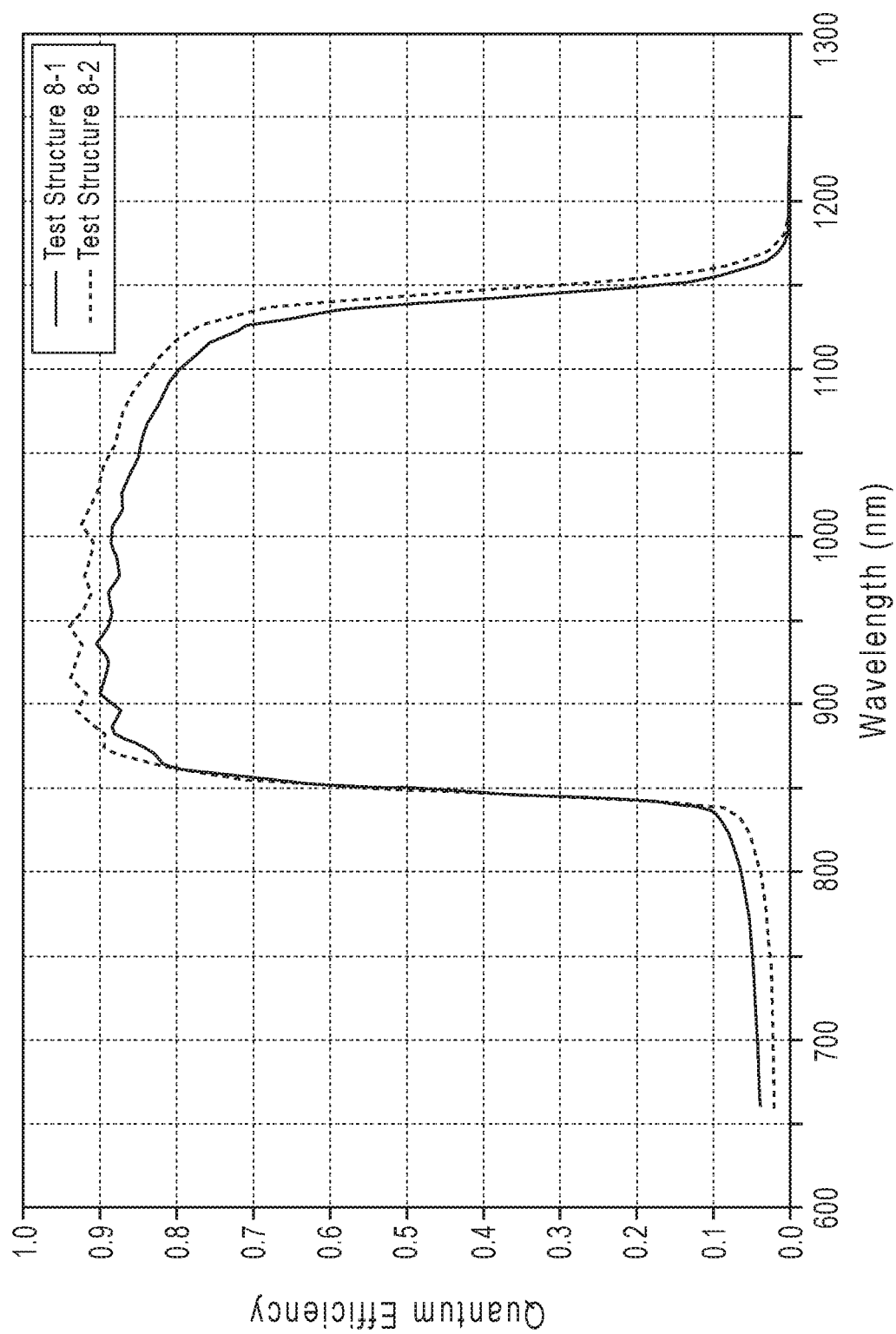
FIG. 9 shows the quantum efficiency of the test structures described in FIG. 8.

In a 4J embodiment of the disclosure, AlGaAs is used as a hydrogen barrier. The thickness of AlGaAs ranges from 100 nm to 5 microns, such as, for example, from 100 nm to 2 µm, from 100 nm to 1 µm, from 100 nm to 500 nm, or from 100 nm to 200 nm. AlGaAs can comprise, for example, $Al_xGa_{1-x}As$ with an aluminum content where $0.05 < x \leq 1$, such as $0.05 < x \leq 0.8$, or $0.05 < x \leq 0.6$, or $0.05 < x \leq 0.5$, or $0.05 < x \leq 0.4$, $0.05 < x \leq 0.3$, or $0.1 < x \leq 0.4$. A thin layer of aluminum material can be used if the aluminum content is sufficiently high, and a thick layer of aluminum material can be used if the percentage of aluminum is low. In addition to AlGaAs, other aluminum materials that can be used as hydrogen barrier layers include AlGaAsSb, AlGaAsBi, AlInP, AlInGaP, AlInGaPSb, AlInGaPBi, AlInGaAs, AlInGaAsSb, AlInGaAsBi, AlN, AlNSb, and AlNBi. The at least one aluminum-containing layer can comprise AlGaAs or InAlP. An aluminum-containing material can comprise, for example, from from 5 mol % to 100 mol % of aluminum, from 10 mol % to 80 mol %, from 20 mol % to 60 mol %, from 25 mol % to 55 mol %, from 30 at % to 50 mol %, or from 35 mol % to 45 mol %, where mol % is based on the fraction of group-III atoms in the aluminum-containing material. Table 4 and FIG. 8 describe test structures, each with an aluminum barrier disposed above the tunnel junction, according to the embodiments shown in FIG. 3A and FIG. 14, that were exposed to either nitrogen (test structure 8-1) or arsine (test structure 8-2) in an MOCVD reactor. Both structures, 8-1 and 8-2, exhibited good and comparable dilute nitride QE, indicating that the barrier layers were effective in preventing hydrogen contamination. In the absence of an aluminum barrier, the dilute nitride was damaged due to arsine exposure (Table 3, and FIGS. 6 and 7). Using test structure 8-1 as a reference, the presence of an aluminum barrier preserved the quality of dilute nitride in test structure 8-2 (FIG. 9).

TABLE 4

Test structures with aluminum barrier and MOCVD environment

| Test structure | Junctions | MBE-grown aluminum barrier | MOCVD environment |
|---|---|---|---|
| 8-1 | Dilute nitride/Ge | 40 mol % Al, 200 nm | Nitrogen |
| 8-2 | Dilute nitride/Ge | 40 mol % Al, 200 nm | Arsine |

Figure 11:
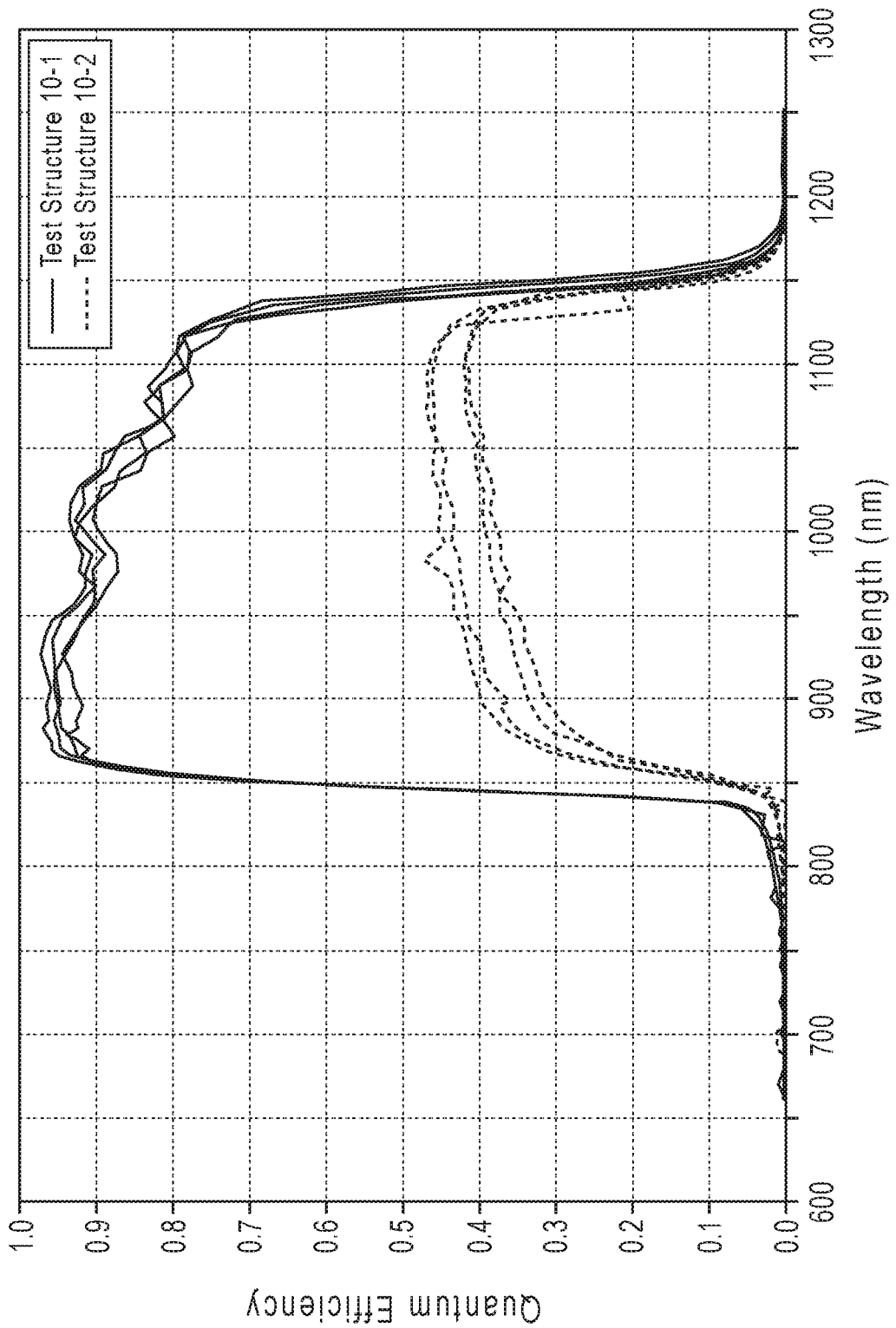
FIG. 11 shows the quantum efficiency of the dilute nitride J3 subcell of test structures described in FIG. 10.
Figure 12:
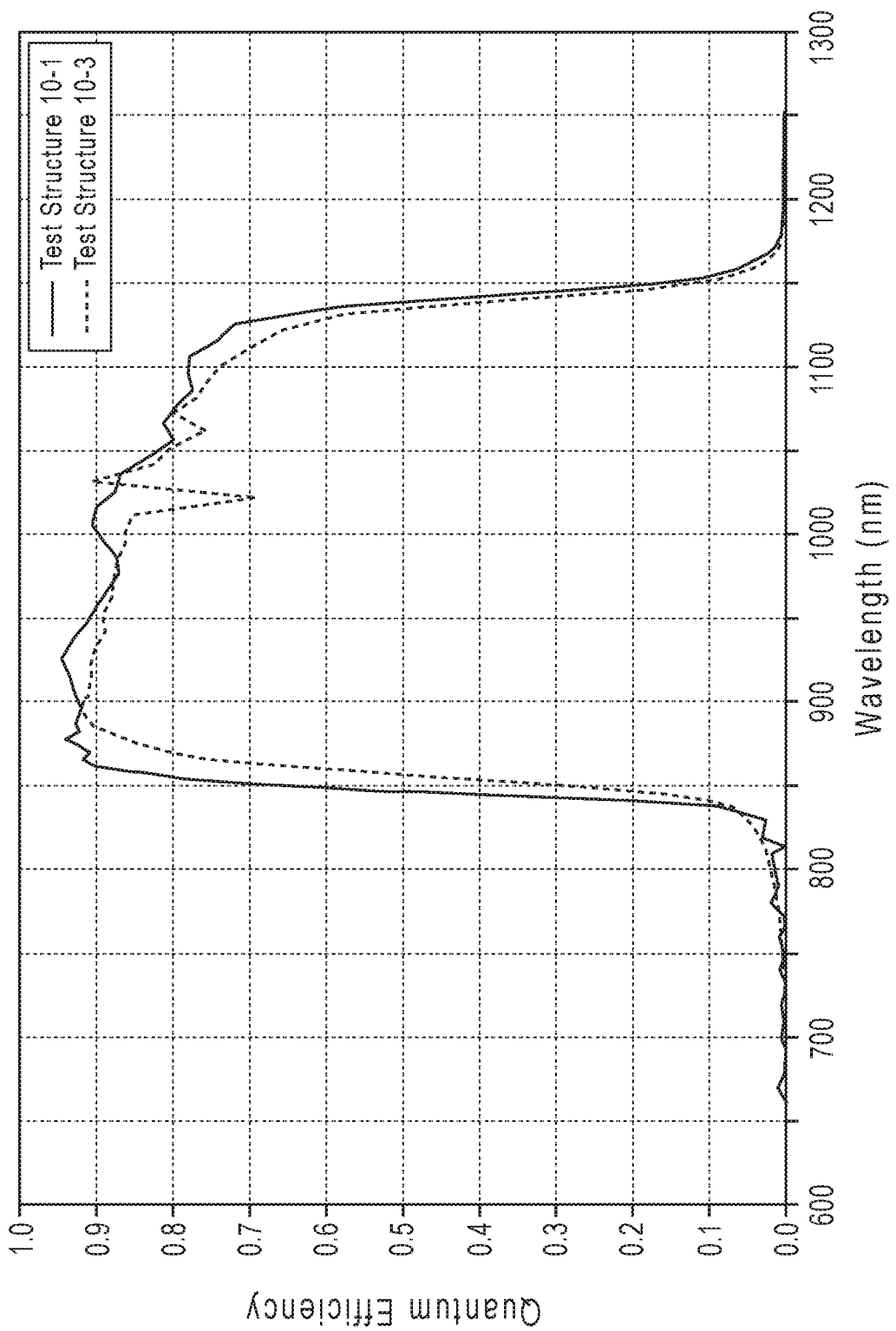
FIG. 12 shows the quantum efficiency of the dilute nitride J3 subcell of test structures described in FIG. 10.

In a 4J embodiment of the disclosure (test structure 10-3), superior dilute nitride QE was observed when both post-epitaxy thermal treatment and the aluminum barrier were implemented (Table 5, FIGS. 10-12). Test structures 10-1, 2 and 3 had the same semiconductor layers. Test structure 10-1 was grown only by MBE whereas test structures 10-2 and 10-3 were fabricated by the hybrid method. Only test structure 10-3 was exposed to thermal treatment after hybrid epitaxy, which restored the dilute nitride QE (FIGS. 10-2 and 10-3). High quality Jsc, Voc, fill factor and efficiency correlated with post-epitaxy thermal treatment and the presence of an aluminum barrier (Table 6).

TABLE 5

Structure of 4J solar cells with an aluminum barrier and post-epitaxy thermal treatment.

| Test structure | Junctions | Aluminum barrier | Epitaxial method | Post-epitaxy thermal treatment |
|---|---|---|---|---|
| 10-1 | AlInGaP/InAlGaAs/ Dilute nitride/Ge | 40 mol % Al 200 nm | MBE | No |
| 10-2 | AlInGaP/InAlGaAs/ Dilute nitride/Ge | 40 mol % Al 200 nm | MBE and MOCVD | No |
| 10-3 | AlInGaP/InAlGaAs/ Dilute nitride/Ge | 40 mol %Al 200 nm | MBE and MOCVD | Yes |

TABLE 6

Performance data for hybrid-grown 4J solar cells at AM0.

| Test structure | Voc | FF | Jsc | Efficiency |
|---|---|---|---|---|
| 10-2 | 3.0 V | 66 | 7.9 mA/cm$^2$ | 12% |
| 10-3 | 3.3 V | 81 | 14.3 mA/cm$^2$ | 28% |

The change in performance of the dilute nitride sub-cell is believed to be caused by hydrogen diffusion from the MOCVD growth environment into the dilute nitride material. The presence of nitrogen in the dilute nitride semiconductor can introduce strong localized potentials due to the large electronegativity of N compared to As and Sb, which can attract hydrogen. Hydrogen diffusion from MOCVD growth is also known to cause effects such as dopant passivation-compensation, introduction of isolated donors, and may cause other defects such as complex defects of nitrogen and hydrogen. These effects can change the doping profile of the dilute nitride material, resulting in degradation of the electrical and optical performance of a sub-cell. In any embodiment of a multijunction solar cell that has a layer of dilute nitride, a hydrogen getter material (or diffusion barrier material) caps the dilute nitride before the epiwafer is removed from the low-hydrogen environment of the MBE. Once in the MOCVD, the hydrogen getter preserves the quality of the underlying dilute nitride by absorbing hydrogen gas on its surface or within the layer, and preventing diffusion of hydrogen into the underlying dilute nitride layer. A structure comprising an aluminum-containing layer overlying a dilute nitride layer can reduce the dopant passivation-compensation in the dilute nitride layer, for example, to less than $1\times10^{16}$ cm$^{-3}$, less than $1\times10^{15}$ cm$^{-3}$, or less than the background doping level of the dilute nitride layer. A structure comprising an aluminum-containing layer overlying a dilute nitride layer can reduce the introduction of isolated donors and other defects such as complex defects of nitrogen and hydrogen into the dilute nitride layer, for example, to less than $1\times10^{16}$ cm$^{-3}$, less than $1\times10^{15}$ cm$^{-3}$, or less than the background doping $10^{16}$ level of the dilute nitride layer. Background doping concentrations, also referred to as the dopant passivation level, for dilute nitride layers can be less than $1\times10^{16}$ cm' or less than $1\times10^{15}$ cm$^{-3}$. Background doping levels and doping passivation levels can be measured using electrochemical capacitance-voltage (ECV) profiling. Defect densities can be measured using techniques including deep-level transient spectroscopy (DLTS), and thermally stimulated current and capacitance measurements (TSM). A dilute nitride layer can have a defect density, for example, less than $1\times10^{16}$ cm$^{-3}$, less than $5\times10^{16}$ cm$^{-3}$, or less than $1\times10^{15}$ cm$^{-3}$.

High performance multijunction solar cells provided by the present disclosure can be characterized by an open circuit voltage Voc greater than 3.0 V, a fill factor greater than 75%, a short circuit current density Jsc greater than 13 mA/cm$^2$, an efficiency greater than 25%, an Eg/q-Voc greater than 0.5, measured using a 1 sun AM0 source at a junction temperature of 25° C.

High performance multijunction solar cells provided by the present disclosure can be characterized by an open circuit voltage Voc greater than 3.25 V, a fill factor greater than 80%, a short circuit current density Jsc greater than 14 mA/cm$^2$, an efficiency greater than 28%, an Eg/q-Voc greater than 0.5, measured using a 1 sun AM0 source at a junction temperature of 25° C.

To fabricate solar cells provided by the present disclosure, a plurality of layers is deposited on a substrate in a first materials deposition chamber. The plurality of layers may include etch stop layers, release layers (i.e., layers designed to release the semiconductor layers from the substrate when a specific process sequence, such as chemical etching, is applied), contact layers such as lateral conduction layers, buffer layers, or other semiconductor layers. For example, the sequence of layers deposited can be a buffer layer(s), then a release layer(s), and then a lateral conduction or contact layer(s). Next the substrate can be transferred to a second materials deposition chamber where one or more junctions are deposited on top of the existing semiconductor layers. The substrate may then be transferred to either the first materials deposition chamber or to a third materials deposition chamber for deposition of one or more junctions and then deposition of one or more contact layers. Tunnel junctions are also formed between the junctions.

The movement of the substrate and semiconductor layers from one materials deposition chamber to another is referred to as a transfer. For example, a substrate can be placed in a first materials deposition chamber, and then the buffer layer(s) and the bottom junction(s) can be deposited. Then the substrate and semiconductor layers can be transferred to a second materials deposition chamber where the remaining junctions are deposited. The transfer may occur in vacuum, at atmospheric pressure in air or another gaseous environment, or in any environment in between. The transfer may further be between materials deposition chambers in one location, which may or may not be interconnected in some way, or may involve transporting the substrate and semiconductor layers between different locations, which is known as transport. Transport may be done with the substrate and semiconductor layers sealed under vacuum, surrounded by nitrogen or another gas, or surrounded by air. Additional semiconductor, insulating or other layers may be used as surface protection during transfer or transport, and removed after transfer or transport before further deposition.

A dilute nitride junction can be deposited in a first materials deposition chamber, and the (Al)(In)GaP and (Al)(In)GaAs junctions can be deposited in a second materials deposition chamber, with tunnel junctions formed between the junctions. A transfer occurs in the middle of the growth of one junction, such that the junction has one or more layers deposited in one materials deposition chamber and one or more layers deposited in a second materials deposition chamber.

To fabricate solar cells provided by the present disclosure, some or all of the layers of the dilute nitride junctions and the tunnel junctions can be deposited in one materials deposition chamber by molecular beam epitaxy (MBE), and the remaining layers of the solar cell can be deposited by chemical vapor deposition (CVD) in another materials deposition chamber. For example, a substrate can be placed in a first materials deposition chamber and layers that may include nucleation layers, buffer layers, emitter and window layers, contact layers and tunnel junctions can be grown on the substrate, followed by one or more dilute nitride junctions. If there is more than one dilute nitride junction, then a tunnel junction is grown between adjacent junctions. One or more tunnel junction layers may be grown, and then the substrate can be transferred to a second materials deposition chamber where the remaining solar cell layers are grown by chemical vapor deposition. In certain embodiments, the chemical vapor deposition system is a MOCVD system. In a related embodiment, a substrate is placed in a first materials deposition chamber and layers that may include nucleation layers, buffer layers, emitter and window layers, contact layers and a tunnel junction are grown on the substrate by chemical vapor deposition. Subsequently, the top junctions, two or more, are grown on the existing semiconductor layers, with tunnel junctions grown between the junctions. Part of the topmost dilute nitride junction, such as the window layer, may then be grown. The substrate is then transferred to a second materials deposition chamber where the remaining semiconductor layers of the topmost dilute nitride junction may be deposited, followed by up to three more dilute nitride junctions, with tunnel junctions between them.

A solar cell can be subjected to one or more thermal annealing treatments after growth. For example, a thermal annealing treatment includes the application of a temperature of 400° C. to 1,000° C. for between 10 microseconds and 10 hours. Thermal annealing may be performed in an atmosphere that includes air, nitrogen, arsenic, arsine, phosphorus, phosphine, hydrogen, forming gas, oxygen, helium, or any combination of the preceding materials. In certain embodiments, a stack of junctions and associated tunnel junctions may be annealed prior to fabrication of additional junctions.

Method provided by the present disclosure include methods of forming the semiconductor device of claim 1, comprising: depositing the least one aluminum-containing layer overlying the dilute nitride layer; and depositing at least one semiconductor layer overlying the at least one aluminum-containing layer, wherein the dilute nitride layer and the at least one aluminum-containing layer are deposited using molecular beam epitaxy (MBE) and the at least one semiconductor layer is deposited using metal-organic chemical vapor deposition (MOCVD).

Method provided by the present disclosure include methods for forming a semiconductor device comprising: depositing at least one aluminum-containing layer overlying a dilute nitride layer; and depositing at least one semiconductor layer overlying the at least one aluminum-containing layer, wherein the dilute nitride layer and the at least one aluminum-containing layer are deposited using molecular beam epitaxy (MBE) and the at least one semiconductor layer is deposited using metal-organic chemical vapor deposition (MOCVD), and wherein the dilute nitride layer has a background doping concentration less than $10^{16}$ cm$^{-3}$.

While embodiments described herein are for photovoltaic cells comprising a dilute nitride layer, the structures and methods described can also be used in photonic devices including solar cells, photodetectors, optical modulators and lasers; and electronic devices such as heterojunction bipolar transistors (HBT), a high-electron mobility transistors (HEMT), a pseudomorphic high-electron mobility transistors (PHEMT), and metal-semiconductor field-effect transistors (MESFET).

Aspects of the Invention

Aspect 1. A semiconductor device comprising an aluminum layer overlying a dilute nitride layer.

Aspect 2. The semiconductor device of aspect 1, wherein the aluminum layer comprises AlGaAs, or AlGaAsSb, AlGaAsBi, AlInP, AlInGaP, AlInGaPSb, AlInGaPBi, AlInGaAs, AlInGaAsSb, AlInGaAsBi, AlN, AlNSb, and AlNBi.

Aspect 3. The semiconductor device of any one of aspects 1 to 2, wherein the aluminum layer comprises AlGaAs.

Aspect 4. The semiconductor device of any one of aspects 1 to 3, wherein the aluminum layer has a thickness within a range from 100 nm to 5 μm.

Aspect 5. The semiconductor device of any one of aspects 1 to 4, wherein the aluminum layer comprises an aluminum content within a range from 5 mol % to 40 mol %.

Aspect 6. The semiconductor device of any one of aspects 1 to 5, wherein the aluminum layer comprises: an aluminum content within a range from 30 mol % to 50 mol %; and a thickness within a range from 100 nm to 300 nm.

Aspect 7. The semiconductor device of any one of aspects 1 to 6, wherein the dilute nitride layer comprises GaInNAsSb, GaInNAsBi, GaInNAsSbBi, GaNAsSb, GaNAsBi or GaNAsSbBi.

Aspect 8. The semiconductor device of any one of aspects 1 to 7, wherein the dilute nitride layer comprises GaInNAsSb.

Aspect 9. The semiconductor device of any one of aspects 1 to 8, wherein the aluminum layer and the dilute nitride layer are grown by molecular beam epitaxy.

Aspect 10. The semiconductor device of any one of aspects 1 to 9, wherein, the semiconductor device comprises a plurality of semiconductor layers; and each of the plurality of semiconductor layers is substantially lattice matched to each of the other semiconductor layers.

Aspect 11. The semiconductor device of any one of aspects 1 to 10, wherein the semiconductor device comprises a multijunction solar cell.

Aspect 12. The semiconductor device of aspect 11, wherein the multijunction solar cell comprises: a substrate underlying the dilute nitride layer; and one or more junctions overlying the aluminum layer.

Aspect 13. The semiconductor device of aspect 12, wherein the substrate comprises GaAs, InP, GaSb, (Sn,Si)Ge, or silicon.

Aspect 14. The semiconductor device of any one of aspects 11 to 13, wherein each of the one or more junctions independently comprises AlInGaP or (Al)(In)GaAs.

Aspect 15. The semiconductor device of aspect 12, wherein, the substrate comprises (Sn,Si)Ge; the dilute nitride layer comprises GaInNAsSb; and each of the one or more junctions independently comprises AlInGaP or InAlGaAs.

Aspect 16. The semiconductor device of any one of aspects 11 to 15, wherein each of the aluminum layer, the dilute nitride layer, the substrate, and the one or more second junctions, is substantially lattice matched to each other.

Aspect 17. The semiconductor device of any one of aspects 12 to 16, wherein, each of the dilute nitride layer and the aluminum layer is grown by molecular beam epitaxy; and each of the substrate and the one or more junctions is grown by metal-organic chemical vapor deposition.

Aspect 18. The semiconductor device of any one of aspects 11 to 17, wherein the multijunction solar cell is a four-junction multijunction solar cell, and is characterized by an open circuit voltage Voc greater than 3.0 V, a fill factor greater than 75%, a short circuit current density Jsc greater than 13 mA/cm$^2$, an efficiency greater than 25%, an Eg/q-Voc greater than 0.5, measured using a 1 sun AM0 source at a junction temperature of 25° C.

Aspect 19. A method of fabricating a semiconductor device comprising a dilute nitride layer, comprising providing a substrate; growing a dilute nitride layer overlying the substrate using molecular beam epitaxy; growing an aluminum layer overlying the dilute nitride layer using molecular beam epitaxy; applying a first thermal treatment to the substrate, the dilute nitride layer, and the aluminum layer; growing one or more semiconductor layers overlying the annealed aluminum layer using metal-organic chemical vapor deposition; and applying a second thermal treatment to the substrate, the dilute nitride layer, the aluminum layer, and the one or more semiconductor layers.

Aspect 20. The method of aspect 19, wherein the first thermal treatment comprises rapid thermal annealing.

Aspect 21. The method of any one of aspects 19 to 20, wherein the rapid thermal annealing comprises applying a temperature within a range from 600° C. to 900° C. for a duration from 5 seconds to 3 hours.

Aspect 22. The method of any one of aspects 19 to 21, wherein the second thermal treatment comprises applying a temperature within a range from 400° C. to 1,000° C. for between 10 microseconds and 10 hours.

Aspect 23. The method of any one of aspects 19 to 22, wherein the dilute nitride layer comprises GaInNAsSb, GaInNAsBi, GaInNAsSbBi, GaNAsSb, GaNAsBi or GaNAsSbBi.

Aspect 24. The method of any one of aspects 19 to 23, wherein the dilute nitride layer comprises GaInNAsSb.

Aspect 25. The method of any one of aspects 19 to 24, wherein each of the substrate, the dilute nitride layer, the aluminum layer, and the one or more semiconductor layers is substantially lattice matched to each of the other layers.

Aspect 26. The method of any one of aspects 19 to 25, wherein the semiconductor device comprises a multijunction solar cell.

Aspect 27. The method of any one of aspects 19 to 26, wherein, the substrate comprises GaAs, InP, GaSb, (Sn,Si)Ge, or silicon; the dilute nitride layer comprises GaInNAsSb, GaInNAsBi, GaInNAsSbBi, GaNAsSb, GaNAsBi or GaNAsSbBi; and each of the one or more semiconductor layers independently comprises AlInGaP or (Al)(In)GaAs.

Aspect 28. The method of any one of aspects 19 to 27, wherein the substrate comprises GaAs, InP, GaSb, (Sn,Si)Ge, or silicon.

Aspect 29. The method of any one of aspects 19 to 28, wherein each of the one or more semiconductor layers independently comprises AlInGaP or (Al)(In)GaAs.

Aspect 30. The method of any one of aspects 19 to 29, wherein, the substrate comprises Ge; the dilute nitride layer comprises GaInNAsSb; and each of the or more semiconductor layers independently comprises AlInGaP or InAlGaAs.

Aspect 1A. A semiconductor device comprising at least one aluminum-containing layer overlying a dilute nitride layer, wherein the dilute nitride layer has a background doping concentration less than $10^{16}$ cm$^{-3}$.

Aspect 2A. The semiconductor device of aspect 1A, wherein the at least one aluminum-containing layer comprises AlGaAs, AlGaAsSb, AlGaAsBi, AlInP, AlInGaP, AlInGaPSb, AlInGaPBi, AlInGaAs, AlInGaAsSb, AlInGaAsBi, AlN, AlNSb, or AlNBi.

Aspect 3A. The semiconductor device of aspect 1A, wherein the at least one aluminum-containing layer comprises AlGaAs or InAlP Aspect 4A. The semiconductor device of any one of aspects 1A to 3A, wherein the at least one aluminum-containing layer has a thickness from 100 nm and 5 microns.

Aspect 5A. The semiconductor device of any one of aspects 1A to 4A, wherein the at least one aluminum-containing layer comprises an intentional dopant.

Aspect 6A. The semiconductor device of any one of aspects 1A to 5A, wherein the dilute nitride layer comprises a dopant passivation level less than $10^{16}$ atoms/cm$^3$.

Aspect 7A. The semiconductor device of any one of aspects 1A to 5A, wherein the dilute nitride layer comprises a dopant passivation level less than $10^{15}$ atoms/cm$^3$.

Aspect 8A. The semiconductor device of any one of aspects 1A to 7A, wherein the at least one aluminum-containing layer comprises one aluminum-containing layer.

Aspect 9A. The semiconductor device of any one of aspects 1A to 7A, wherein the at least one aluminum-containing layer comprises two aluminum-containing layers, wherein each the two aluminum-containing layers comprise different aluminum-containing alloys.

Aspect 10A. The semiconductor device of any one of aspects 1A to 9A, wherein the dilute nitride layer comprises a defect density less than $10^{16}$ cm$^{-3}$.

Aspect 11A. The semiconductor device of any one of aspects 1A to 10A, wherein the at least one aluminum-containing layer comprises an aluminum alloy, wherein the aluminum alloy comprises an aluminum content within a range from 5 mol % to 80 mol %, wherein mol % is based on the fraction of group-III atoms in the aluminum-containing material.

Aspect 12A. The semiconductor device of any one of aspects 1A to 11A, wherein the at least one aluminum-containing layer comprises: an aluminum alloy, wherein the aluminum alloy comprises an aluminum content within a range from 30 mol % to 50 mol %, wherein mol % wherein mol % is based on the fraction of group-III atoms in the aluminum-containing material; and a thickness within a range from 100 nm to 300 nm.

Aspect 13A. The semiconductor device of any one of aspects 1A to 12A, wherein the dilute nitride layer and the at least one overlying aluminum-containing layer are deposited using molecular beam epitaxy (MBE).

Aspect 14A. The semiconductor device of any one of aspects 1A to 13A, comprising a semiconductor layer overlying and adjacent the at least one aluminum-containing layer.

Aspect 15A. The semiconductor device of aspect 14, wherein the semiconductor layer comprises GaAs, InGaAs, or InGaP Aspect 16A. The semiconductor device of any one of aspects 14A to 15A, wherein the semiconductor layer has a thickness from 1 nm to 50 nm.

Aspect 17A. The semiconductor device of any one of aspects 14A to 16A, wherein the semiconductor layer is deposited using metal-organic chemical vapor deposition (MOCVD).

Aspect 18A. The semiconductor device of any one of aspects 1A to 13A, comprising at least one semiconductor layer overlying the at least one aluminum-containing layer.

Aspect 19A. The semiconductor device of aspect 18A, wherein the at least one semiconductor layer is deposited using metal-organic chemical vapor deposition (MOCVD).

Aspect 20A. The semiconductor device of any one of aspects 1A to 19A, wherein the semiconductor device comprises a multijunction solar cell.

Aspect 21A. The semiconductor device of aspect 20A, wherein the multijunction solar cell comprises a first junction comprising a first base layer comprising the dilute nitride layer; and a second junction overlying the first junction, wherein the second junction comprises a second base layer.

Aspect 22A. The semiconductor device of aspect 21A, wherein the at least one aluminum-containing layer overlies the dilute nitride layer and underlies the second base layer.

Aspect 23A. The semiconductor device of aspect 20A, wherein the at least one aluminum-containing layer is selected from an aluminum-containing cap layer, an aluminum-containing back surface field, an aluminum-containing reflector layer, an aluminum-containing window layer, and a combination of any of the foregoing.

Aspect 24A. The semiconductor device of aspect 23A, wherein each of the aluminum-containing cap layer, the aluminum-containing back surface field, the aluminum-containing reflector layer, and the aluminum-containing window layer comprise one or more aluminum-containing layers.

Aspect 25A. The semiconductor device of any one of aspects 23A to 24A, wherein the aluminum-containing cap layer comprises AlGaAs or InAlP Aspect 26A. The semiconductor device of aspect 25A, wherein the aluminum-containing cap layer has a thickness from 100 nm and 5 microns.

Aspect 27A. The semiconductor device of any one of aspects 23A to 24A, wherein the aluminum-containing back surface field layer comprises AlInGaP.

Aspect 28A. The semiconductor device of aspect 27, wherein the aluminum-containing back surface field layer has a thickness from 50 nm to 300 nm.

Aspect 29A. The semiconductor device of any one of aspects 23A to 24A, wherein the aluminum-containing reflector layer is a distributed Bragg reflector.

Aspect 30A. The semiconductor device of aspect 29A, wherein the aluminum-containing reflector layer comprises AlAs, AlGaAs, GaAs, InAs, InGaAs, AlInAs, InGaP, AlInGaP, InGaP, GaP, InP, AlP, AlInP, or AlInGaAs.

Aspect 31A. The semiconductor device of any one of aspects 23A to 24A, wherein the aluminum-containing window layer comprises AlGaAs or AlInP, Aspect 32A. The semiconductor device of aspect 31A, wherein the aluminum-containing window layer has a thickness from 100 nm and 5 microns.

Aspect 33A. The semiconductor device of aspect 20A, wherein the dilute nitride layer and the at least one aluminum-containing layer are deposited using molecular beam epitaxy (MBE) and the at least one semiconductor layer is deposited using metal-organic chemical vapor deposition (MOCVD).

Aspect 34A. The semiconductor device of any one of aspects 1A to 19A, wherein the semiconductor device comprises a solar cell, a photodetector, an optical modulator, a laser, or a transistor.

Aspect 35A. A method of forming the semiconductor device of any one of aspects 1A to 34A, comprising: depositing the least one aluminum-containing layer overlying the dilute nitride layer; and depositing at least one semiconductor layer overlying the at least one aluminum-containing layer, wherein the dilute nitride layer and the at least one aluminum-containing layer are deposited using molecular beam epitaxy (MBE) and the at least one semiconductor layer is deposited using metal-organic chemical vapor deposition (MOCVD).

Aspect 36A. A method for forming a semiconductor device comprising: depositing at least one aluminum-containing layer overlying a dilute nitride layer; and depositing at least one semiconductor layer overlying the at least one aluminum-containing layer, wherein the dilute nitride layer and the at least one aluminum-containing layer are deposited using molecular beam epitaxy (MBE) and the at least one semiconductor layer is deposited using metal-organic chemical vapor deposition (MOCVD), and wherein the dilute nitride layer has a background doping concentration less than $10^{16}$ cm$^-$ It should be noted that there are alternative ways of implementing the embodiments disclosed herein. Accordingly, the present embodiments are to be considered as illustrative and not restrictive. Furthermore, the claims are not to be limited to the details given herein and are entitled their full scope and equivalents thereof.

What is claimed is:

1. A multijunction solar cell comprising:
 (a) a first subcell, wherein the first subcell comprises a first base layer, wherein,
  the first base layer comprises GaInNAsSb;
  the first base layer has a background doping concentration less than $10^{16}$ cm$^{-3}$;
  the first base layer is lattice-matched to GaAs or Ge;
  the first base layer has a hydrogen-induced defect density, wherein the hydrogen-induced defect density is less than the background doping concentration;
  the first base layer has a band gap from 0.7 to 1.2 eV; and
  the first subcell does not comprise an aluminum-containing layer;
 (b) an aluminum-containing hydrogen-diffusion barrier layer overlying and on the first subcell, wherein,
  the aluminum-containing hydrogen-diffusion barrier layer comprises AlGaAs, AlGaAsSb, AlGaAsBi, AlInP, AlInGaP, AlInGaPSb, AlInGaPBi, AlInGaAs, AlInGaAsSb, AlInGaAsBi, AlN, AlNSb, or AlNBi;
  the aluminum-containing hydrogen-diffusion barrier layer has a thickness from 100 nm to 500 nm the aluminum-containing hydrogen-diffusion barrier layer comprises an aluminum alloy, wherein the aluminum alloy comprises an aluminum content within a range from 35 mol % to 45 mol %, wherein mol % is based on the fraction of group-III atoms in the aluminum alloy; and the aluminum-containing layer comprises absorbed hydrogen;

(c) a hydrogen-containing layer overlying and on the aluminum-containing hydrogen-diffusion barrier layer; and (d) a second subcell overlying a tunnel junction.

2. The multijunction solar cell of claim 1, wherein the aluminum-containing hydrogen-diffusion barrier layer comprises AlGaAs.

3. The multijunction solar cell of claim 1, wherein the background doping concentration is less than $10^{15}$ atoms/cm$^3$.

4. The multijunction solar cell of claim 1, comprising:
an emitter overlying the first base layer, wherein the emitter does not comprise aluminum; and
the aluminum-containing hydrogen-diffusion barrier layer overlies the emitter.

5. The multijunction solar cell of claim 1, further comprising a substrate underlying the first subcell, wherein,
the substrate comprises Ge or GaAs; and
the multijunction solar cell has an open circuit voltage Voc greater than 3.0 V, a fill factor greater than 75%, a short circuit current density Jsc greater than 13 mA/cm$^2$, an efficiency greater than 25%, an Eg/q-Voc greater than 0.5, measured using a 1 sun AM0 source at a junction temperature of 25° C.

6. The multijunction solar cell of claim 1, wherein,
the aluminum-containing layer comprises a top surface; and
the top surface comprises absorbed hydrogen.

* * * * *